(12) United States Patent
Song et al.

(10) Patent No.: US 12,262,591 B2
(45) Date of Patent: Mar. 25, 2025

(54) DISPLAY DEVICE INCLUDING PIXELS WITH DIFFERENT TYPES OF TRANSISTORS

(71) Applicant: SAMSUNG DISPLAY CO., LTD., Yongin-si (KR)

(72) Inventors: Hee Rim Song, Yongin-si (KR); Hyun Joon Kim, Yongin-si (KR); Hae Min Kim, Yongin-si (KR); Mee Hye Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/465,700

(22) Filed: Sep. 12, 2023

(65) Prior Publication Data

US 2023/0422557 A1     Dec. 28, 2023

Related U.S. Application Data

(63) Continuation of application No. 17/929,691, filed on Sep. 3, 2022, now Pat. No. 11,758,766, which is a (Continued)

(30) Foreign Application Priority Data

Jun. 23, 2020 (KR) ........................ 10-2020-0076713

(51) Int. Cl.
    *G09G 3/32*         (2016.01)
    *G09G 3/3233*      (2016.01)
(Continued)

(52) U.S. Cl.
    CPC ....... *H10K 59/1213* (2023.02); *G09G 3/3233* (2013.01); *G09G 3/3266* (2013.01);
(Continued)

(58) Field of Classification Search
    CPC ............. H01L 27/3262; H01L 27/1225; H01L 27/3265; H01L 27/3272; H01L 27/3276;
(Continued)

(56) References Cited

U.S. PATENT DOCUMENTS 10,199,447 B2    2/2019   Jeong et al.
10,276,101 B2    4/2019   Chun
(Continued)

FOREIGN PATENT DOCUMENTS

CN        108630147       10/2018
CN        110890387 A     3/2020
(Continued)

*Primary Examiner* — Pegeman Karimi
(74) *Attorney, Agent, or Firm* — F. CHAU & ASSOCIATES, LLC

(57) ABSTRACT

A display device may include a plurality of pixels each including a light emitting element. A first scan line and a second scan line are disposed in each of the pixels. A data line is disposed in each of the pixels. A power line is disposed in each of the pixels. A reference voltage line is disposed in each of the pixels. A first transistor controls a current of the light emitting element. A second transistor is connected between the data line and a first gate electrode of the first transistor. A third transistor is connected between the reference voltage line and a first electrode of the first transistor. A fourth transistor is connected between the power line and a second electrode of the first transistor. The fourth transistor may be a transistor of a type different from that of the first to third transistors.

14 Claims, 20 Drawing Sheets

Related U.S. Application Data continuation of application No. 17/229,289, filed on Apr. 13, 2021, now Pat. No. 11,437,456.

(51) Int. Cl.
  *G09G 3/3266* (2016.01)
  *G09G 3/3283* (2016.01)
  *H10K 59/121* (2023.01)
  *H10K 59/126* (2023.01)
  *H10K 59/131* (2023.01)
  *H01L 27/12* (2006.01)

(52) U.S. Cl.
  CPC ....... *G09G 3/3283* (2013.01); *H10K 59/1216* (2023.02); *H10K 59/126* (2023.02); *H10K 59/131* (2023.02); *G09G 2300/0426* (2013.01); *G09G 2330/02* (2013.01); *H01L 27/1225* (2013.01)

(58) Field of Classification Search
  CPC .. G09G 3/3233; G09G 3/3266; G09G 3/3283; G09G 3/32; G09G 2300/0426; G09G 2330/02; G09G 3/34; G09G 3/36
  See application file for complete search history.

(56) References Cited

U.S. PATENT DOCUMENTS

| | | |
|---|---|---|
| 10,665,162 B2 | 5/2020 | Lee et al. |
| 2015/0170570 A1 | 6/2015 | Kim et al. |
| 2015/0243220 A1* | 8/2015 | Kim .................... H01L 27/1225 345/215 |
| 2016/0247452 A1 | 8/2016 | Lee et al. |
| 2016/0379570 A1 | 12/2016 | Lee et al. |
| 2017/0061870 A1* | 3/2017 | Kang ................... G09G 3/3233 |
| 2017/0092199 A1* | 3/2017 | Park ..................... G09G 3/3258 |
| 2019/0035322 A1* | 1/2019 | Kim .................... H01L 27/1225 |
| 2021/0399072 A1 | 12/2021 | Song et al. |
| 2022/0077268 A1 | 3/2022 | Liu et al. |
| 2023/0006018 A1 | 1/2023 | Song et al. |

FOREIGN PATENT DOCUMENTS

| | | |
|---|---|---|
| EP | 3 113 226 | 1/2017 |
| KR | 10-2018-0078476 | 7/2018 |
| KR | 10-2018-0127882 | 11/2018 |
| WO | WO 2020/091165 | 5/2020 |

\* cited by examiner

DISPLAY DEVICE INCLUDING PIXELS WITH DIFFERENT TYPES OF TRANSISTORS

CROSS-REFERENCE TO RELATED APPLICATION

The present application is a Continuation of co-pending U.S. patent application Ser. No. 17/929,691, filed on Sep. 3, 2022, which is a Continuation of U.S. patent application Ser. No. 17/229,289, filed on Apr. 13, 2021 (issued on Sep. 6, 2022 as U.S. Pat. No. 11,437,456), which claims priority under 35 U.S.C. § 119(a) to Korean patent application 10-2020-0076713 filed on Jun. 23, 2020 in the Korean Intellectual Property Office, the entire disclosure of which is herein incorporated by reference.

TECHNICAL FIELD

The present disclosure generally relates to a display device including a pixel.

DISCUSSION OF THE RELATED ART

As display devices of higher resolutions for a given size are becoming more widely used, the structure of the circuitry for each pixel is becoming more complicated leading to potential problems in display quality such as capacitive coupling between data lines and gate electrodes of the pixel transistors.

SUMMARY

A display device includes a plurality of pixels disposed on a substrate. The plurality of pixels each include a light emitting element, a first scan line and a second scan line, disposed in each of the pixels. The first scan line and the second scan line, respectively apply an $i^{th}$ (where i is a positive integer) scan signal and an (i+1)th scan signal. A data line is disposed in each of the pixels to apply a data signal. A power line is disposed in each of the pixels to apply a driving power source. A reference voltage line is disposed in each of the pixels to apply a reference voltage. A first transistor controls a current of the light emitting element. A second transistor is connected between the data line and a first gate electrode of the first transistor. The second transistor is turned on by the $i^{th}$ scan signal. A third transistor is connected between the reference voltage line and a first electrode of the first transistor. The third transistor is turned on by the (i+1)th scan signal. A fourth transistor is connected between the power line and a second electrode of the first transistor. The fourth transistor is turned off when an emission control signal is supplied to an emission control line.

The fourth transistor may be a transistor of a type different from that of the first to third transistors.

Each of the first to third transistors may be an oxide transistor, and the fourth transistor may be a poly-silicon transistor.

The display device may further include a buffer layer and a gate insulating layer, sequentially disposed on the substrate. First to fourth insulating layers may be sequentially disposed on the gate insulating layer.

The display device may further include first to third conductive patterns disposed on the first insulating layer. The first to third conductive patterns may be spaced apart from each other. The first conductive pattern may overlap the first transistor when viewed on a plane. The second conductive pattern may overlap the second transistor when viewed on a plane. The third conductive pattern may overlap the third transistor when viewed on a plane.

The first gate electrode of the first transistor, a second gate electrode of the second transistor, a third gate electrode of the third transistor, and the first and second scan lines may be disposed on the third insulating layer. A fourth gate electrode of the fourth transistor may be disposed on the gate insulating layer. The second gate electrode of the second transistor may be electrically connected to the second conductive pattern, and the third gate electrode of the third transistor may be electrically connected to the third conductive pattern.

The first transistor may include a first active pattern disposed on the second insulating layer. The first gate electrode may be disposed on the third insulating layer. The first electrode and the second electrode, respectively, may be in contact with both end portions of the first active pattern. The first conductive pattern may be electrically connected to one of the first and second electrodes of the first transistor.

The display device may further include a storage capacitor including a lower electrode disposed on the first insulating layer and an upper electrode overlapping the lower electrode with the second and third insulating layers interposed therebetween. The lower electrode may be integrally provided with the first conductive pattern, and the upper electrode may be integrally provided with the first gate electrode. As used herein, the phrase "integrally provided" is to be understood as meaning that the two elements are formed contiguously as a single element.

The display device may further include an opening exposing a portion of the second insulating layer by removing a portion of the third insulating layer between the first gate electrode of the first transistor and the first conductive pattern. The opening may overlap the first gate electrode of the first transistor and the first conductive pattern when viewed on a plane. The reference voltage line, the data line, and the power line may be disposed on the fourth insulating layer.

The display device may further include a connection line disposed on the fourth insulating layer. The connection line may electrically connect the third transistor and the light emitting element to each other.

The display device may further include a passivation layer disposed over the connection line. The light emitting element may include a first electrode disposed on the passivation layer. The first electrode may be electrically connected to the connection line through a contact hole. An emitting layer may be disposed on the first electrode. A second electrode may be disposed on the emitting layer.

The power line may overlap the first transistor when viewed on a plane.

The display device may further include a lower electrode disposed on the gate insulating layer and an upper electrode disposed on the fourth insulating layer. The upper electrode may be electrically connected to the lower electrode through a first contact hole sequentially penetrating the gate insulating layer and the first to fourth insulating layers.

The first gate electrode of the first transistor may be disposed between the lower electrode and the upper electrode. The first conductive pattern may be disposed between the lower electrode and the first gate electrode.

The lower electrode, the first conductive pattern, the first gate electrode, and the upper electrode may overlap each other when viewed on a plane.

The display device may further include first and second passivation layers sequentially disposed on the fourth insulating layer and a first connection line disposed on the fourth insulating layer. The first connection line may electrically connect the third transistor and the light emitting element to each other.

The reference voltage line may be disposed on the fourth insulating layer, and the data line and the power line may be disposed on the first passivation layer.

The display device may further include a bridge pattern disposed on the first passivation layer. The bridge pattern may be spaced apart from each of the data line and the power line. The bridge pattern may be electrically connected to the first connection line through a contact hole penetrating the first passivation layer.

The light emitting element may include a first electrode disposed on the second passivation layer, the first electrode being electrically connected to the bridge pattern through a contact hole penetrating the second passivation layer. An emitting layer may be disposed on the first electrode. A second electrode may be disposed on the emitting layer.

The display device may further include a shielding member located between the data line and the first gate electrode of the first transistor. The shielding member may be disposed on the fourth insulating layer.

The fourth transistor may include a fourth active pattern disposed on the buffer layer. The fourth gate electrode may be disposed on the gate insulating layer. First and second electrodes, respectively, may be in contact with both end portions of the fourth active pattern. One of the first and second electrodes may be electrically connected to the power line through a second connection line disposed on the fourth insulating layer.

The shielding member may be connected to the one electrode through a contact hole sequentially penetrating the gate insulating layer and the first to fourth insulating layers, to be electrically connected to the power line. The driving power source applied to the power line may be transferred to the shielding member.

The shielding member may be electrically connected to one of the first and second electrodes of the first transistor.

The reference voltage line may extend in one direction when viewed on a plane, and the data line and the power line may extend in parallel to the reference voltage line when viewed on a plane.

The data line may be disposed between the reference voltage line and the power line when viewed on a plane.

The power line may be disposed between the reference voltage line and the data line when viewed on a plane.

The power line may cover the first transistor and may cover at least a portion of each of the second and third transistors when viewed on a plane.

A display device includes a plurality of pixels disposed on a substrate. Each of the plurality of pixels includes a light emitting element. A first scan line and a second scan line, are disposed in each of the pixels, the first scan line and the second scan line, respectively applying an $i^{th}$ (wherein i is a positive integer) scan signal and an $(i+1)^{th}$ scan signal. A data line is disposed in each of the pixels to apply a data signal. A power line is disposed in each of the pixels to apply a driving power source. A reference voltage line is disposed in each of the pixels to apply a reference voltage. A first transistor controls a current of the light emitting element, the first transistor being an oxide transistor. A shielding member is disposed between the data line and the first transistor. A second transistor is connected between the data line and a first gate electrode of the first transistor, the second transistor being turned on by the $i^{th}$ scan signal, the second transistor being an oxide transistor. A third transistor is connected between the reference voltage line and a first electrode of the first transistor, the third transistor being turned on by the $(i+1)^{th}$ scan signal, the third transistor being an oxide transistor. A fourth transistor is connected between the power line and a second electrode of the first transistor, the fourth transistor being turned off when an emission control signal is supplied to an emission control line, the fourth transistor being a poly-silicon transistor.

The power line may cover a portion of the first transistor when viewed on a plane.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

In the drawing figures, dimensions may be exaggerated for clarity of illustration. It will be understood that when an element is referred to as being "between" two elements, it can be the only element between the two elements, or one or more intervening elements may also be present. Like reference numerals may refer to like elements throughout the disclosure and the drawings.

DETAILED DESCRIPTION

Figure 1:
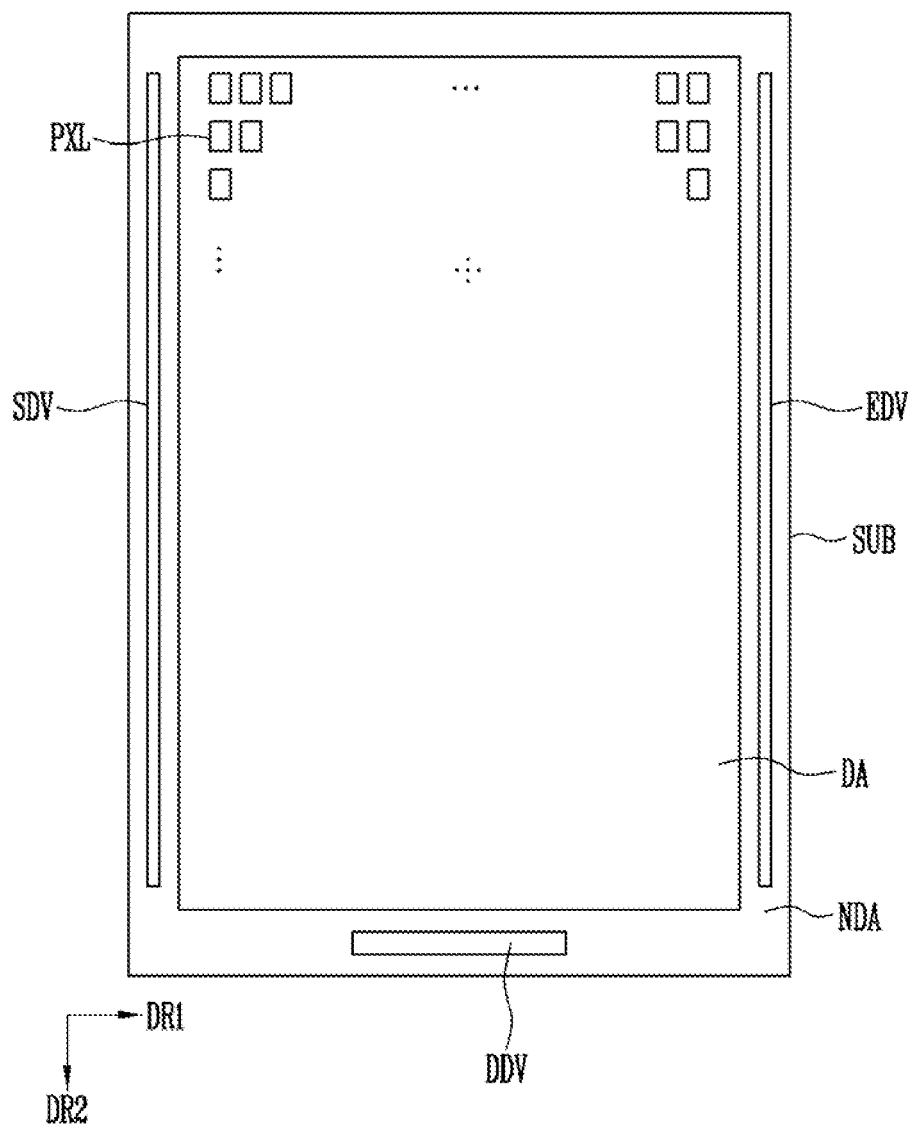
FIG. 1 is a plan view illustrating a display device in accordance with an embodiment of the present disclosure.

In describing embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Like numbers may refer to like elements throughout the specification and the drawings. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element and are not intended to signify an order in which the elements are arranged. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. However, the terms "comprises" and/or "comprising" are intended to preclude the presence and/or addition of other elements. Further, an expression that an element such as a layer, region, substrate or plate is placed "on" or "above" another element indicates not only a case where the element is placed "directly on" or "just above" the other element but also a case where a further element is interposed between the element and the other element. Similarly, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, embodiments of the present disclosure and items required for those skilled in the art to easily understand the content of the present disclosure will be described in detail with reference to the accompanying drawings.

FIG. 1 is a plan view illustrating a display device in accordance with an embodiment of the present disclosure.

Referring to FIG. 1, the display device in accordance with the embodiment of the present disclosure may include a substrate SUB, pixels PXL disposed on the substrate SUB, a driving unit which is disposed on the substrate SUB and drives the pixels PXL, and a line unit connecting the pixels PXL and the driving unit.

The substrate SUB may include a display area DA and a non-display area NDA.

The display area DA may be an area in which the pixels PXL for displaying an image are disposed.

The non-display area NDA may be an area in which the driving unit for driving the pixels PXL some of lines connecting the pixels PXL and the driving unit are disposed. There might be no pixels PXL disposed within the non-display area NDA.

The display area DA may have various shapes. For example, the display area DA may be provided in various shapes such as a closed polygon including linear sides, a circle, an ellipse, etc., including a curved side, and a semicircle, a semi-ellipse, etc., including linear and curved sides. When the display area DA includes a plurality of areas, each area may also be provided in various shapes such as a closed polygon including linear sides, and a circle, an ellipse, etc., including a curved side. In the embodiment of the present disclosure, a case where the display area DA is provided as one area having a quadrilateral shape including linear sides is described as an example.

The non-display area NDA may be disposed on at least one side of the display area DA. In an example, the non-display area NDA may at least partially surround the circumference of the display area DA.

The pixels PXL may be disposed in the display area DA on the substrate SUB, and may be connected to the lines connecting the pixels. Each of the pixels PXL is a minimum unit for displaying an image, and may be provided in plural.

Each of the pixels PXL may include a light emitting element emitting white light and/or color light and a pixel circuit for driving the light emitting element. The pixel circuit may include at least one transistor connected to the light emitting element. Each pixel PXL may emit light of any one color among red, green, and blue, but the present disclosure is not necessarily limited thereto. For example, each pixel PXL may emit light of one color among cyan, magenta, yellow, and white.

The pixels PXL may be provided in plural and may be arranged along rows extending in a first direction DR1 and columns extending in a second direction DR2 intersecting the first direction DR1. The arrangement form of the pixels PXL is not particularly limited to this arrangement, and the pixels PXL may be arranged in various forms.

The driving unit provides a signal to each pixel PXL through the line unit, and accordingly, can control driving of each pixel PXL. For convenience of description, the line unit is omitted in FIG. 1. The line unit will be described later.

The driving unit may include a scan driver SDV which transfers a scan signal to the pixels PXL through scan lines, an emission driver EDV, which transfers an emission control signal to the pixels PXL through emission control lines, a data driver DDV which transfers a data signal to the pixels PXL through data lines, and a timing controller. The timing controller may control the scan driver SDV, the emission driver EDV, and the data driver DDV.

In an embodiment of the present disclosure, the scan driver SDV, the emission driver EDV, and the data driver DDV may be disposed in the non-display area NDA of the substrate SUB. Positions of the scan driver SDV, the emission driver EDV, and/or the data driver DDV may be changed, if necessary.

Figure 2:
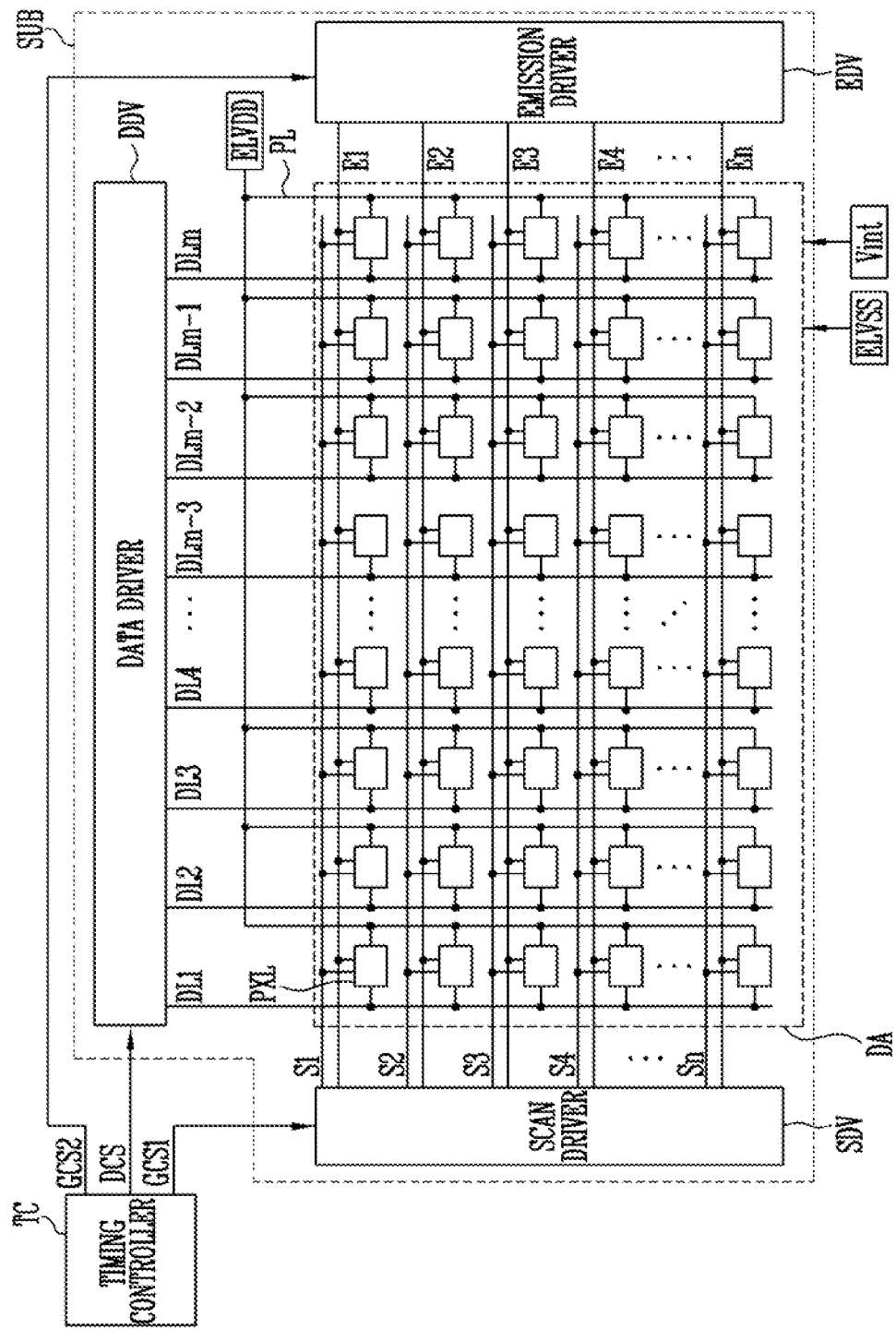
FIG. 2 is a block diagram illustrating an embodiment of pixels and a driving unit in the display device shown in FIG. 1.

FIG. 2 is a block diagram illustrating an embodiment of the pixels and the driving unit in the display device shown in FIG. 1.

Referring to FIGS. 1 and 2, the display device, in accordance with the embodiment of the present disclosure, may include pixels PXL, a driving unit, and a line unit.

The driving unit may include a scan driver SDV, an emission driver EDV, a data driver DDV, and a timing controller TC.

In FIG. 2, positions of the scan driver SDV, the emission driver EDV, the data driver DDV, and the timing controller TC are set for convenience of description. When an actual display device is implemented, the scan driver SDV, the emission driver EDV, the data driver DDV, and the timing controller TC may be disposed at other positions in the display.

Each of the pixels PXL may include a light emitting element emitting light and a pixel circuit for driving the light emitting element. The pixel circuit may include at least one transistor for driving the light emitting element. Each of the pixels PXL may compensate for an electrical characteristic change of the corresponding pixel PXL in real time by using the pixel circuit.

The line unit may include data lines DL1 to DLm disposed in the display area DA to apply a data voltage (or data signal) to the pixels PXL from the driving unit, scan lines S1 to Sn used to apply a scan signal to the pixels PXL, emission control lines E1 to En used to apply an emission control signal to the pixels PXL, and reference voltage line used to sense an electrical characteristic of the pixels PXL. In some embodiments, two or more scan signals may be applied to each pixel PXL.

The pixels PXL may be disposed in the display area DA. Each pixel PXL may be supplied with a data signal from a corresponding data line when the scan signal is supplied from a corresponding scan line. The corresponding pixel PXL supplied with the data signal may control an amount of current flowing from a first driving power source ELVDD applied through a power line PL to a second driving power source ELVSS via the light emitting element. Each of the pixels PXL may be connected to a reference voltage line, and an initialization power source Vint (or reference voltage) may be applied to the corresponding pixel PXL through the reference voltage line. The reference voltage line will be described later with reference to FIG. 3.

The scan driver SDV may apply the scan signal to the scan lines S1 to Sn in response to a first gate signal GCS1 from the timing controller TC. For example, when the scan driver SDV sequentially supplies the scan signal to the scan lines S1 to Sn, the pixels PXL may be sequentially selected in units of horizontal lines.

The emission driver may supply the emission control signal to the emission control lines E1 to En in response to a second gate control signal GCS2 from the timing controller TC. For example, the emission driver EDV may sequentially supply the emission control signal to the emission control lines E1 to En.

The emission control signal may have a width wider than that of the scan signal. For example, the emission control signal supplied to an $i^{th}$ (wherein i is a positive integer) emission control line Ei may be supplied to overlap, in at least a partial period, both the scan signal supplied to an $(i-1)^{th}$ h scan line Si-1 and the scan signal supplied to an $i^{th}$ scan line Si.

As used herein, the phrase, "$i^{th}$ where i is a positive integer" means the set of $\{1^{st}, 2^{nd}, 3^{rd}, 4^{th}, 5^{th}, \ldots\}$, the phrase c $(i-1)^{th}$ means the set of $\{0^{th}, 1^{st}, 2^{nd}, 3^{rd}, 4^{th}, \ldots\}$, and the phrase "$(i+1)^{th}$" means the set of $\{2^{nd}, 3^{rd}, 4^{th}, 5^{th}, 6^{th}, \ldots\}$.

Additionally, the emission control signal may be set to a gate-off voltage (e.g., a high voltage) such that transistors included in the pixels PXL can be turned off, and the scan signal may be set to a gate-on voltage (e.g., a low voltage) such that the transistors included in the pixels PXL can be turned on.

The data driver DDV may supply the data signal to the data lines D1 to Dm in response to a data control signal DCS. The data signal supplied to the data lines D1 to Dm may be supplied to pixels PXL selected by the scan signal.

The timing controller TC may supply, respectively to the scan driver SDV and the emission driver EDV, the gate control signals GCS1 and GCS2 generated based on timing signals supplied from an external source. Also, the timing controller TC may supply the data control signal DCS to the data driver DDV.

A start pulse and clock signals may be included in each of the gate control signals GCS1 and GCS2. The start pulse may control a timing of a first scan signal or a first emission control signal. The clock signals may be used to shift the start pulse.

A source start pulse and clock signals may be included in the data control signal DCS. The source start pulse may control a sampling start time of data, and the clock signals may be used to control a sampling operation of the data.

In a sensing mode for measuring an electrical characteristic variation of each of the pixels PXL before a product is released or while the product is being driven, a data voltage (or data signal) for sensing is generated by converting test data received from a grayscale-luminance measurement system, and is supplied to sensing target pixels PXL through the data lines DL1 to DLm. The grayscale-luminance measurement system senses an electrical characteristic of each of the pixels PXL, derives an electrical characteristic variation between the pixels PXL, particularly, a compensation value (offset) of a pixel PXL, which is used to compensate for a threshold voltage variation of a driving transistor, based on the sensing result, and stores the compensation value of the pixel in a memory or updates a pre-stored value.

The grayscale-luminance measurement system used in the sensing mode may be electrically connected to the memory when the grayscale-luminance measurement system operates in the sensing mode.

In a normal driving mode, a compensation value from the memory is loaded to an internal compensation memory of the data driver DDV, when power is applied to the display device. The data driver DDV may include a sensing unit. The sensing unit may sense an electrical characteristic of each of the pixels PXL, e.g., a threshold voltage of the driving transistor in an aging process before the product is released, and may transmit the sensed electrical characteristic to the grayscale-luminance measurement system. In an example, in the case of an application, the sensing unit may update the compensation value in real time by sensing an electrical characteristic of each of the pixels PXL in the normal driving mode after the product is released. However, the present disclosure is not necessary so-limited.

In an embodiment of the present disclosure, each of the pixels PXL may compensate for a threshold voltage of a driving element by using an external compensation method. The pixels PXL may compensate for only an electron mobility and a temperature variation by using an internal compensation method. The pixels PXL may sample the threshold voltage of the driving element, and may compensate for the electron mobility and the temperature variation of the driving element in rear time by using the internal compensation method, without any period in which the threshold voltage is compensated. Thus, the present disclosure can be applied to an application required to perform high-speed driving at a frame rate of 120 Hz or higher.

According to an embodiment of the present disclosure, the display device may include at least one pixel having a light emitting element, a first scan line carrying a first scan signal, a second scan line carrying a second scan signal, a first transistor controlling the light emitting element, a second transistor controlled by the first scan signal, a third transistor controlled by the second scan signal, and a fourth transistor. The first through third transistors may be of a first type and the fourth transistor may be of a second type different than the first type. Moreover, the pixel may further include a data line carrying a data signal, a power line carrying a driving power source, and a reference voltage line carrying a reference voltage. The second transistor may be connected between the data line and a first gate electrode of the first transistor. The third transistor may be connected between the reference voltage line and a first electrode of the first transistor. The fourth transistor is connected between the power line and a second electrode of the first transistor, the fourth transistor being turned off when an emission control signal is supplied to an emission control line FIG. 3 is a circuit diagram illustrating an embodiment of an electrical connection relationship of components included in one pixel among the pixels shown in FIG. 2.

Figure 3:
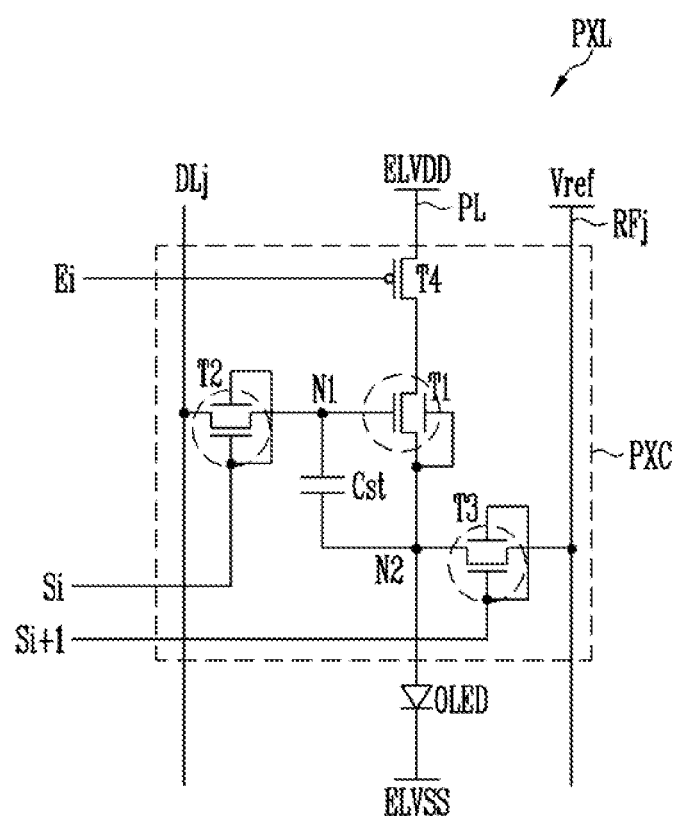
FIG. 3 is a circuit diagram illustrating an embodiment of an electrical connection relationship of components included in one pixel among pixels shown in FIG. 2.

In FIG. 3, the pixel PXL includes not only components included in each of the pixels shown in FIG. 2 but also an area in which the components are provided.

Referring to FIGS. 1 and 3, each pixel PXL may include a light emitting element OLED and a pixel circuit PXC electrically connected to the light emitting element OLED to drive the light emitting element OLED.

An anode of the light emitting element OLED may be connected to the pixel circuit PXC. The light emitting element OLED generates light (or rays) with a predetermined luminance corresponding to an amount of current supplied from the pixel circuit PXC. To this end, the second driving power source ELVSS may be set to a voltage lower than that of the first driving power source ELVDD during a driving period of the display device.

The pixel circuit PXC may control an amount of current flowing from the first driving power source ELVDD to the second driving power source ELVSS via the light emitting element OLED, corresponding to a data signal (or data voltage). To this end, the pixel circuit PXC may include first to fourth transistors T1 to T4 and a storage capacitor Cst.

One electrode of the first transistor T1 (e.g. driving transistor) may be connected to the power line PL to which the first driving power source ELVDD via the fourth transistor T4, and another electrode of the first transistor T1 may be connected to a second node N2. The first transistor T1 controls an amount of current flowing from the first driving power source ELVDD to the second driving power source ELVSS via the light emitting element OLED, corresponding to a voltage of a first node N1 as a gate electrode thereof.

In an embodiment of the present disclosure, the first transistor T1 may be an oxide transistor. In an example, the first transistor T1 may be implemented as an NMOS transistor including an oxide semiconductor having a low off-current. The off-current is understood to be a leakage current flowing between one electrode and another electrode of a transistor in an off-state of the transistor. Since a thin film transistor having a low off-current has a small amount of leakage current even when the off-state of the thin film transistor is long, the thin film transistor can minimize a luminance change of the pixels PXL when the pixels PXL are driven at a low speed. The other electrode of the first transistor T1 may be electrically connected to a first conductive pattern made of an electrically conductive material. The first conductive pattern may be disposed under the first transistor T1, and may partially overlap the first transistor T1.

The second transistor T2 (e.g. switching transistor) may be connected to the gate electrode of the first transistor T1 through a $j^{th}$ data line DLj connected to each pixel PXL and the first node N1. A gate electrode of the second transistor T2 may be connected to an i scan line Si connected to the corresponding pixel PXL. The second transistor T2 is turned on by an $i^{th}$ scan signal applied to the $i^{th}$ scan line Si, to supply a data voltage transferred from the $i^{th}$ data line DLj to the first node N1. The second transistor T2 may include one electrode connected to the $j^{th}$ data line DLj and another electrode connected to the first node N1.

In an embodiment of the present disclosure, the second transistor T2 may be an oxide semiconductor. In an example, the second transistor T2 may be implemented as an NMOS transistor including an oxide semiconductor having a low off-current. The gate electrode of the second transistor T2 may be connected to a second conductive pattern made of an electrically conductive material. The second conductive pattern may be disposed under the second transistor T2, and may partially overlap the second transistor T2.

The display device, in accordance with the embodiment of the present disclosure, may drive the pixels PXL at a low speed by lowering a frame rate so as to reduce consumption power in a still image. Since a data update period is lengthened, a leakage current occurs in each of the pixels PXL, and therefore, a flicker may appear. When a luminance of the pixels PXL is periodically changed, a user may recognize the flicker. Accordingly, when the second transistor T2 having a long off-period is implemented as an NMOS transistor including an oxide semiconductor having a low off-current, a leakage current is reduced in low-speed driving, thereby minimizing a flicker phenomenon.

The third transistor T3 (e.g. sensing transistor) may be connected between a $j^{th}$ reference voltage line RFj to which a reference voltage Vref is applied and the first transistor T1. For example, one electrode of the third transistor T3 may be connected to the $j^{th}$ reference voltage line RFj, and another electrode of the third transistor T3 may be connected to the other electrode of the first transistor T1 through the second node N2.

A gate electrode of the third transistor T3 may be connected to an $(i+1)^{th}$ scan line Si+1 connected to the corresponding pixel PXL. The reference voltage Vref may be a voltage lower than that of the first driving power source ELVDD and/or the data voltage, e.g., a voltage of the initialization power source Vint. The third transistor T3 is turned on by an $(i+1)^{th}$ h scan signal supplied to the $(i+1)^{th}$ h scan line Si+1 during a predetermined sensing period, to electrically connect the $j^{th}$ reference voltage line RFj and the first transistor T1.

The third transistor T3 may operate to supply, to the second node N2, the reference voltage Vref (or the voltage of the initialization power source Vint) transferred through the $j^{th}$ reference voltage line RFj or to sense a voltage or current of the second node N2 or the $j^{th}$ reference voltage line RFj.

In an embodiment of the present disclosure, the third transistor T3 may be an oxide transistor. In an example, the third transistor T3 may be implemented as an NMOS transistor including an oxide semiconductor having a low off-current. The gate electrode of the third transistor T3 may be connected to a third conductive pattern made of an electrically conductive material. The third conductive pattern may be disposed under the third transistor T3, and may partially overlap the third transistor T3.

In some embodiments, the sensing period may be a period in which characteristic information (e.g., a threshold voltage of the first transistor T1, etc.) of each of the pixels PXL arranged in the display area DA is determined (e.g. extracted). During the sensing period, a predetermined reference voltage at which the first transistor T1 can be turned on is supplied to the first node N1 through the $j^{th}$ data line DLj and the second transistor T2, or each pixel PXL is connected to a current source or the like, so that the first transistor T1 can be turned on. In addition, the third transistor T3 is turned on by supplying the $(i+1)^{th}$ scan signal to the third transistor T3, so that the first transistor T1 can be connected to the $j^{th}$ reference voltage line RFj. Accordingly, characteristic information of each pixel PXL, including the threshold voltage of the first transistor T1, etc., is extracted through the $j^{th}$ reference voltage line RFj, to be transferred to the sensing unit of the data driver DDV. The characteristic information extracted through the $j^{th}$ reference voltage line RFj may be used to convert image data such that a characteristic variation between the pixels PXL can be compensated.

The above-described first to third conductive patterns will be described in detail later with reference to FIG. 4.

The fourth transistor T4 may be connected between the power line PL and the first transistor T1, to switch a current path between the power line PL and the first transistor T1 in response to an emission control signal. A gate electrode of the fourth transistor T4 may be connected to a corresponding emission control line, e.g., an $i^{th}$ emission control line Ei. One electrode of the fourth transistor T4 may be connected to the one electrode of the first transistor T1, and another electrode of the fourth transistor T4 may be connected to the power line PL. The fourth transistor T4 is turned off when the emission control signal having a gate-off voltage is supplied to the $i^{th}$ emission control line Ei, and is turned on in other cases. In an embodiment of the present disclosure, the fourth transistor T4 may be a poly-silicon transistor. In an example, the fourth transistor T4 may be implemented as a PMOS transistor including a poly-silicon semiconductor.

The storage capacitor Cst stores the data voltage, and may be connected between the first node N1 and the second node N2.

The above-described pixel circuit PXC may compensate for the threshold voltage of the first transistor T1 as the driving transistor by using an external compensation method, and compensate for an element characteristic of the first transistor T1, e.g., an electron mobility, a temperature variation, or the like in real time for every frame period by using an internal compensation method.

Figure 4:
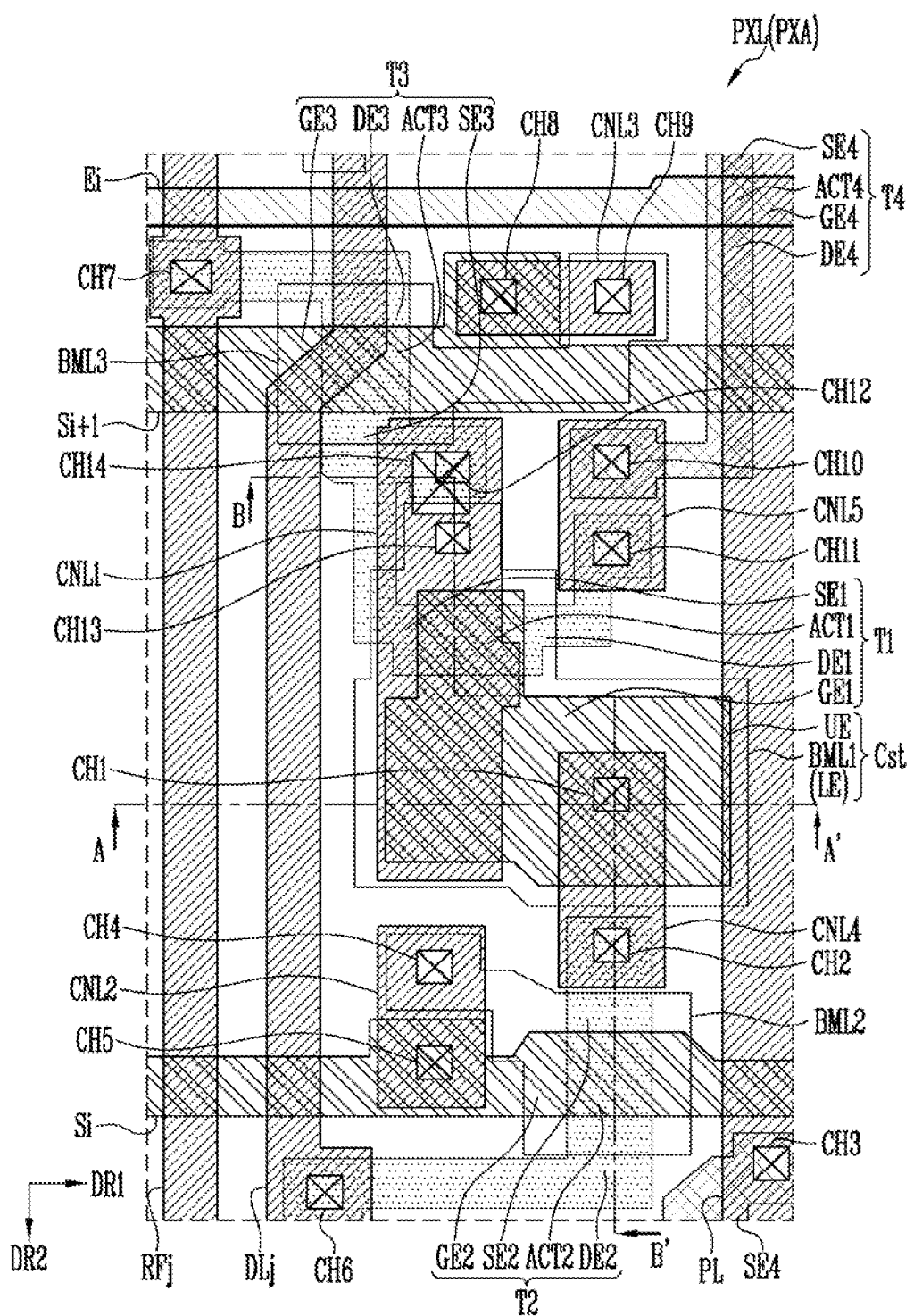
FIG. 4 is a plan view schematically illustrating one pixel shown in FIG. 2.
Figure 5:
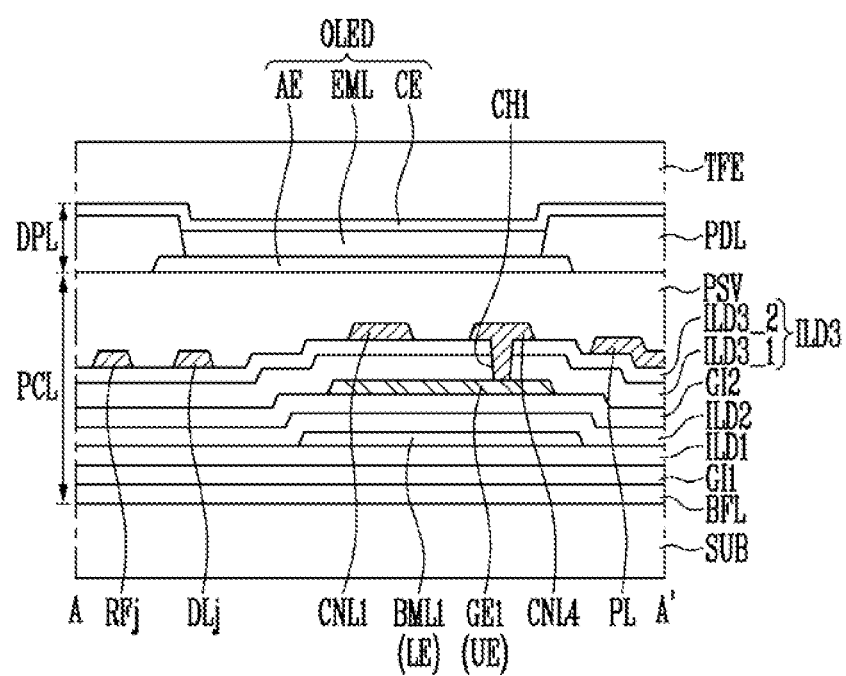
FIG. 5 is a cross-sectional view taken along line A-A' shown in FIG. 4.
Figure 6:
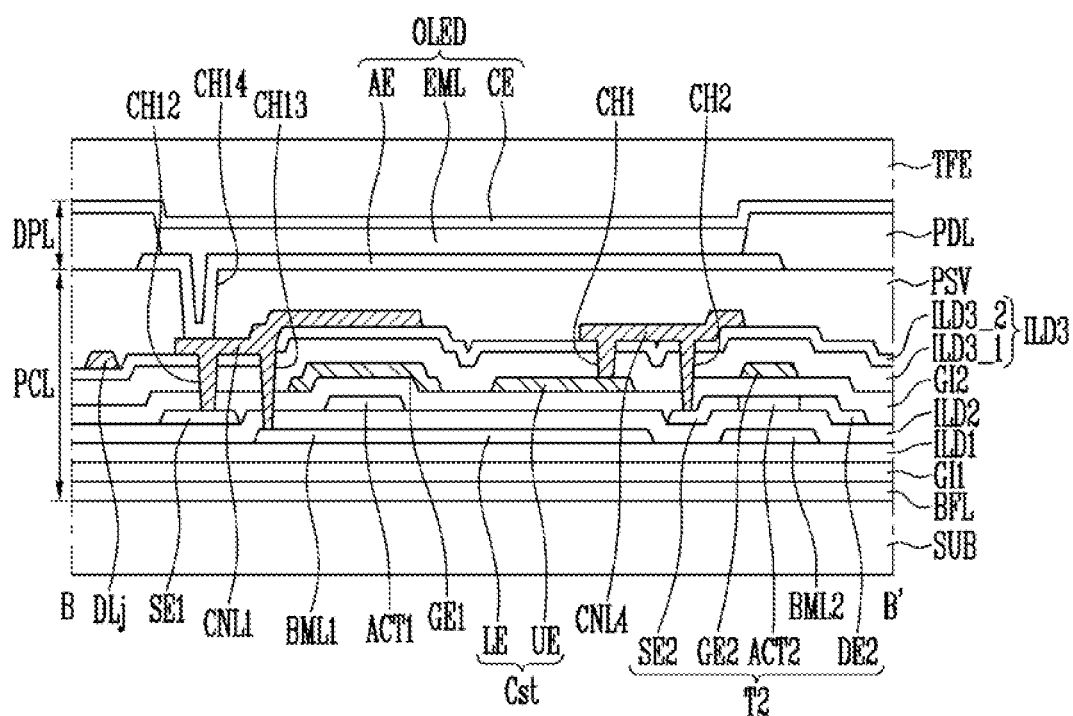
FIG. 6 is a cross-sectional view taken along line B-B' shown in FIG. 4.

FIG. 4 is a plan view schematically illustrating one pixel shown in FIG. 2. FIG. 5 is a cross-sectional view taken along line A-A' shown in FIG. 4. FIG. 6 is a cross-sectional view taken along line B-B' shown in FIG. 4.

For convenience of description, illustration of a light emitting element connected to first to third transistors T1 and T3 is omitted in FIG. 4 but it is to be understood that this elements is still present in the illustrated embodiment.

In FIGS. 4 to 6, with respect to one pixel PXL disposed on an $i^{th}$ pixel row and a it h pixel column, which are disposed in the display area DA, there are illustrated scan lines Si and Si+1, an $i^{th}$ emission control line Ei, a $i^{th}$ reference voltage line RFj, a $i^{th}$ data line DLj, and a power line PL, which are connected to the pixel PXL.

For convenience of description, a scan line on an $i^{th}$ row is referred to as a "first scan line Si," a scan line on an $(i+1)^{th}$ row is referred to as a "second scan line Si+1," the $i^{th}$ emission control line Ei is referred to as an "emission control line Ei," and the $j^{th}$ data line DLj is referred to as a "data line DLj," and the $j^{th}$ reference voltage line RFj is referred to as a "reference voltage line RFj."

Also, in FIGS. 4 to 6, the structure of the pixel PXL is simplified and illustrated, such as a case where each electrode is illustrated as a single electrode layer and a case where each insulating layer is illustrated as a single-layered insulating layer. However, the present disclosure is not necessarily limited thereto.

In addition, in an embodiment of the present disclosure, the term "connection" between two components may include both electrical connection and physical connection.

Referring to FIGS. 1 to 6, the display device, in accordance with the embodiment of the present disclosure, may include the substrate SUB, the line unit, and the pixels PXL.

The substrate SUB may include materials to enable light to be transmitted therethrough, including a transparent insulating material. The substrate SUB may be a rigid substrate or a flexible substrate.

The rigid substrate may include, for example, a glass substrate, a quartz substrate, a glass ceramic substrate, and a crystalline glass substrate.

The flexible substrate may include a film substrate and a plastic substrate, which include a polymer organic material. For example, the flexible substrate may include polyethersulfone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and/or cellulose acetate propionate (CAP). The flexible substrate may be able to be bent or flexed without sustaining damage such as cracking.

The material applied to the substrate SUB may have resistance (or heat resistance) against high processing temperature in a manufacturing process of the display device. In an embodiment of the present disclosure, the whole or at least a portion of the substrate SUB may be flexible.

A plurality of insulating layers and a plurality of conductive layers may be disposed on the substrate SUB.

In an embodiment of the present disclosure, the insulating layers may include, for example, a buffer layer BFL, a first gate insulating layer GI1, first and second interlayer insulating layers ILD1 and ILD2, a second gate insulating layer GI2, a third interlayer insulating layer ILD3, and a passivation layer PSV, which are sequentially stacked on the substrate SUB.

The conductive layers may be disposed and/or formed between the above-described insulating layers. In an embodiment of the present disclosure, the conductive layers may include, for example, a first conductive layer disposed on the first gate insulating layer GI1, a second conductive layer disposed on the first interlayer insulating layer ILD1, a third conductive layer disposed on the second gate insulating layer GI2, and a fourth conductive layer disposed on the third interlayer insulating layer ILD3.

Each of the pixels PXL may be disposed in a pixel area PXA included in the display area DA of the substrate SUB.

The pixels PXL may be arranged in a matrix form and/or a stripe form along a plurality of pixel rows extending in the first direction DR1 and a plurality of pixel columns extending in the second direction DR2 intersecting the pixel rows in the display area DA on the substrate SUB, but the present disclosure is not necessarily limited thereto. In some embodiments, the pixels PXL may be provided in various arrangement forms currently known in the art in the display area DA on the substrate SUB.

The line unit may provide a signal to each of the pixels PXL disposed in the display area, and include scan lines Si and Si+1, a data line DLj, an emission control line Ei, a power line PL, and a reference voltage line RFj.

The scan lines Si and Si+1 may extend in the first direction DR1. The scan lines Si and Si+1 may include a first scan line Si and a second scan line Si+1, which are sequentially arranged along the second direction DR2 intersecting the first direction DR1.

A corresponding scan signal may be applied to each of the scan lines Si and Si+1. In an example, an $i^{th}$ scan signal may be applied to the first scan line Si, and an $(i+1)^{th}$ scan signal may be applied to the second scan line Si+1. In an embodiment of the present disclosure, the scan lines Si and Si+1 may be disposed and/or formed on the second gate insulating layer GI2. The scan lines Si and Si+1 may correspond to the third conductive layer disposed on the second gate insulating layer GI2.

The second gate insulating layer GI2 may be an inorganic insulating layer including an inorganic material. In an example, the second gate insulating layer GI2 may include silicon nitride (SiNx), silicon oxide (SiOx), silicon oxynitride (SiOxNy), and/or metal oxide such as aluminum oxide (AlOx). The second gate insulating layer GI2 may be provided as a single layer, but may alternatively be provided as a multi-layer structure including at least two layers. When the second gate insulating layer GI2 is provided in the multi-layer structure, the layers may be formed of the same material or be formed of different materials. The second gate insulating layer GI2 may be made of silicon oxide (SiOx), and have a thickness of about 200 Å to about 3000 Å. In an example, the second gate insulating layer GI2 may be made of silicon oxide (SiOx) having a thickness of about 1400 Å. However, the present disclosure is not necessarily limited thereto. In some embodiments, the second gate insulating layer GI2 may be an organic insulating layer including an organic material.

The emission control line Ei may extend in the first direction DR1, and may be disposed in each of the pixels PXL. An emission control signal may be applied to the emission control line Ei. The emission control line Ei may be disposed and/or formed on the first gate insulating layer GI1, and may be disposed in a layer different from that of the scan lines Si and Si+1. The emission control line Ei may correspond to the first conductive layer disposed on the first gate insulating layer GI1.

The first gate insulating layer GI1 may be an inorganic insulating layer including an inorganic material. The first gate insulating layer GI1 may include the same material as the second gate insulating layer GI2, but the present disclosure is not necessarily limited thereto. In an example, the first gate insulating layer GI1 may be made of silicon oxide (SiOx), and may have a thickness of about 200 Å to about 3000 Å. In an example, the first gate insulating layer GI1 may be made of silicon oxide (SiOx) having a thickness of about 1200 Å.

The data line DLj may extend in the second direction DR2. A data voltage (or data signal) may be applied to the data line DLj. In an embodiment of the present disclosure, the data line DLj may be disposed and/or formed on the third interlayer insulating layer ILD3. The data line DLj may correspond to the fourth conductive layer disposed on the third interlayer insulating layer ILD3.

The third interlayer insulating layer ILD3 may be an inorganic insulating layer including an inorganic material. Also, the third interlayer insulating layer ILD3 may be provided as a single layer or a multi-layer structure. In an example, the third interlayer insulating layer ILD3 may be provided as a multi-layer structure including a first sub-interlayer insulating layer ILD3_1 and a second sub-interlayer insulating layer ILD3_2, which are sequentially stacked. The first sub-interlayer insulating layer ILD3_1 may be made of silicon oxide (SiOx), and may have a thickness of about 200 Å to about 3000 Å. In an example, the first sub-interlayer insulating layer ILD3_1 may be made of silicon oxide (SiOx) having a thickness of about 3000 Å. The second sub-interlayer insulating layer ILD3_2 may be made of silicon oxide (SiOx), and have a thickness of about 200 Å to about 3000 Å. In an example, the second sub-interlayer insulating layer ILD3_2 may be made of silicon oxide (SiOx) having a thickness of about 2000 Å. However, the present disclosure is not necessarily limited thereto. In some embodiments, the third interlayer insulating layer ILD3 may be provided as a single layer, and may be an organic insulating layer including an organic material.

The reference voltage line RFj may extend in the second direction DR2, and may be spaced apart from the data line DLj. A reference voltage Vref may be applied to the reference voltage line RFj. The reference voltage line RFj may be disposed in the same layer as the data line DLj, and may include the same material as the data line DLj. In an embodiment of the present disclosure, the reference voltage line RFj may be disposed and/or formed on the third interlayer insulating layer ILD3. The reference voltage line RFj may correspond to the fourth conductive layer disposed on the third interlayer insulating layer ILD3.

The power line PL may extend primarily along the second direction DR2, and may be spaced apart from the data line DLj. When viewed on a plane, a pixel circuit PXC may be disposed between the power line PL and the data line DLj. One of the first and second driving power sources ELVDD and ELVSS (e.g., the first driving power source ELVDD) may be applied to the power line PL.

When viewed on a plane, the reference voltage line RFj, the data line DLj, and the power line PL may be sequentially disposed along the first direction DR1, and may be spaced apart from each other. In an example, the reference voltage line RFj may be disposed at one side of the data line DLj, and the power line PL may be disposed at the other side of the data line DLj. In an embodiment of the present disclosure, the data line DLj may be disposed on the third interlayer insulating layer ILD3 to be closer to the reference voltage line RFj than the power line PL is to the reference voltage RFj.

Each of the pixels PXL may include a pixel circuit layer PCL having a pixel circuit PXC and a display element layer DPL having a light emitting element OLED emitting light.

For convenience, the pixel circuit layer PCL will be first described, and the display element layer DPL will be then described.

The pixel circuit layer PCL may include the buffer layer BFL disposed on the substrate SUB, the pixel circuit PXC disposed on the buffer layer BFL, and the passivation layer PSV disposed over the pixel circuit PXC.

The buffer layer BFL may be disposed on the substrate SUB, and may prevent an impurity from being diffused into the pixel circuit PXC. The buffer layer BFL may be an inorganic insulating layer including an inorganic material. In an example, the buffer layer BFL may include silicon nitride (SiNx), silicon oxide (SiOx), silicon oxynitride (SiOxNy), and/or metal oxide such as aluminum oxide (AlOx). The buffer layer BFL may be provided as a single layer, but may be provided as a multi-layer structure including at least two layers. When the buffer layer BFL is provided in the multi-layer structure, the layers may be formed of the same material or be formed of different materials. In an example, the buffer layer BFL may be provided as a double layer including a first layer which is made of silicon nitride (SiNx) and has a thickness of about 500 Å to about 1400 Å and a second layer which is made of silicon oxide (SiOx) and has a thickness of about 200 Å to about 3000 Å. However, the present disclosure is not necessarily limited thereto, and the buffer layer BFL may be omitted by considering the material and process conditions of the substrate SUB.

The pixel circuit PXC may include first to fourth transistors T1 to T4 and a storage capacitor Cst, which are disposed on the buffer layer BFL.

The first transistor T1 (e.g. driving transistor) may include a first gate electrode GE1, a first active pattern ACT1, a first source region SE1, and a first drain region DE1.

The first gate electrode GE1 may be connected to a second source region SE2 of the second transistor T2 through a fourth connection line CNL4. The first gate electrode GE1 may be disposed and/or formed on the second gate insulating layer GI2. In an embodiment of the present disclosure, the first gate electrode GE1 may correspond to the third conductive layer disposed on the second gate insulating layer GI2, and may be disposed in the same layer as the first and second scan lines Si and Si+1 to include the same material as the first and second scan lines Si and Si+1.

The fourth connection line CNL4 may correspond to the fourth conductive layer disposed and/or formed on the third interlayer insulating layer ILD3. The fourth connection line CNL4 may be disposed in the same layer as the reference voltage line RFj, the data line DLj, and the power line PL, and may include the same material as the reference voltage line RFj, the data line DLj, and the power line PL.

One end of the fourth connection line CNL4 may be connected to the first gate electrode GE1 through a first contact hole CH1 penetrating the third interlayer insulating layer ILD3. The other end of the fourth connection line CNL4 may be connected to the second source region SE2 of the second transistor T2 through a second contact hole CH2 sequentially penetrating the second gate insulating layer GI2 and the third interlayer insulating layer ILD3.

Each of the first active pattern ACT1, the first source region SE1, and the first drain region DE1 may be a semiconductor pattern made of poly-silicon, amorphous silicon, oxide semiconductor, etc. In an example, the first active pattern ACT1, the first source region SE1, and the first drain region DE1 may be formed of an oxide semiconductor. The first active pattern ACT1, the first source region SE1, and the first drain region DE1 may be made of an oxide semiconductor having a thickness of about 300 Å to about 600 Å, but the present disclosure is not necessarily limited thereto. The oxide semiconductor may include an oxide including titanium (Ti), hafnium (Hf), zirconium (Zr), aluminum (Al), tantalum (Ta), germanium (Ge), zinc (Zn), gallium (Ga), tin (Sn), and/or indium (In), and/or a composite oxide including zinc oxide (ZnO), indium-gallium-zinc oxide (InGaZnO4), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germa-nium-gallium oxide (In—Ge—Ga—O), titanium-indium-zinc oxide (Ti—In—Zn—O), and/or hafnium-indium-zinc oxide (Hf—In—Zn—O).

When the first active pattern ACT1, the first source region SE1, and the first drain region DE1 are made of an oxide semiconductor, a separate protective layer may be added so as to protect the oxide semiconductor which is vulnerable to external environmental conditions such as a high temperature. The first active pattern ACT1, the first source region SE1, and the first drain region DE1 may be disposed on the second interlayer insulating layer ILD2.

The first active pattern ACT1 is a region overlapping the first gate electrode GE1, and may be a channel region of the first transistor T1. When the first active pattern ACT is formed long, the channel region of the first transistor T1 may be formed long. The driving range of a gate voltage (or gate signal) applied to the first transistor T1 may be widened. Thus, the grayscale value of light (or rays) emitted from the light emitting element OLED can be finely controlled.

The first source region SE1 may be connected to one end of the first active pattern ACT1. Also, the first source region SE1 may be connected to a third source region SE3 of the third transistor T3.

The first drain region DE1 may be connected to the other end of the first active pattern ACT1. Also, the first drain region DE1 may be connected to a fourth drain region DE4 of the fourth transistor T4 through a fifth connection line CNL5.

The first active pattern ACT1, the first source region SE1, and the first drain region DE1, which are described above, may be disposed and/or formed on the second interlayer insulating layer ILD2.

The second interlayer insulating layer ILD2 may be an inorganic insulating layer including an inorganic material. In an example, the second interlayer insulating layer ILD2 may include silicon nitride (SiNx), silicon oxide (SiOx), silicon oxynitride (SiOxNy), and/or metal oxide such as aluminum oxide (AlOx). The second interlayer insulating layer ILD2 may be provided as a single layer, but may be provided as a multi-layer structure including at least two layers. In an embodiment of the present disclosure, the second interlayer insulating layer ILD2 may be provided as a single layer which is made of silicon oxide (SiOx) and has a thickness of about 200 Å to about 3000 Å. In an example, the second interlayer insulating layer ILD2 may be provided as a single layer made of silicon oxide (SiOx) having a thickness of about 3000 Å. However, the present disclosure is not necessarily limited thereto. In some embodiments, the second interlayer insulating layer ILD2 may be an organic insulating layer including an organic material, and may be provided as a multi-layer structure having at least two layers.

One end of the fifth connection line CNL5 may be connected to the fourth drain region DE4 of the fourth transistor T4 through a tenth contact hole CH10 sequentially penetrating the first gate insulating layer GI1, the first and second interlayer insulating layers ILD1 and ILD2, the second gate insulating layer GI2, and the third interlayer insulating layer ILD3. The other end of the fifth connection line CNL5 may be connected to the first drain region DE1 of the first transistor T1 through an eleventh contact hole CH11 sequentially penetrating the second gate insulating layer GI2 and the third interlayer insulating layer ILD3.

A first conductive pattern BML1 may be disposed between the first transistor T1 and the substrate SUB. The first conductive pattern BML1 may overlap the first transistor T1 when viewed on a plane. In an embodiment of the present disclosure, the first conductive pattern BML1 may be disposed and/or formed on the first interlayer insulating layer ILD1. The first conductive pattern BML1 may correspond to the second conductive layer disposed on the first interlayer insulating layer ILD1.

In an embodiment of the present disclosure, the first interlayer insulating layer ILD1 may be an inorganic insulating layer including an inorganic material. In an example, the first interlayer insulating layer ILD1 may include silicon nitride (SiNx), silicon oxide (SiOx), silicon oxynitride (SiOxNy), and/or metal oxide such as aluminum oxide (AlOx). The first interlayer insulating layer ILD1 may be provided as a single layer, but may alternately be provided as a multi-layer structure including at least two layers. The first interlayer insulating layer ILD1 may be provided as a single layer which is made of silicon nitride (SiNx) and has a thickness of about 500 Å to about 1400 Å. In an example, the first interlayer insulating layer ILD1 may be made of silicon nitride (SiNx) having a thickness of about 1400 Å, but the present disclosure is not necessarily limited thereto.

The first conductive pattern BML1 may be connected to a first connection line CNL1 through a thirteenth contact hole CH13 sequentially penetrating the second interlayer insulating layer ILD2, the second gate insulating layer GI2, and the third interlayer insulating layer ILD3.

The first connection line CNL1 may be disposed and/or formed on the third interlayer insulating layer ILD3, and may overlap the first transistor T1 and the first conductive pattern BML1. In an embodiment of the present disclosure, the first connection line CNL1 may correspond to the fourth conductive layer disposed on the third interlayer insulating layer. The first connection line CNL1 may be disposed in the same layer as the reference voltage line RFj, the data line DLj, the power line PL, and the like, and include the same material as the reference voltage line RFj, the data line DLj, the power line PL, and the like. The first connection line CNL1 may be connected to the first source region SE1 of the first transistor T1 through a twelfth contact hole CH12 sequentially penetrating the second gate insulating layer GI2 and the third interlayer insulating layer ILD3.

In an embodiment of the present disclosure, the first connection line CNL1 may be connected to the first source region SE1 of the first transistor T1 through the twelfth contact hole CH12, and may be connected to the first conductive pattern BML1 through the thirteenth contact hole 13. Consequently, the first source region SE1 of the first transistor T1 may be connected to the first conductive pattern BML1 through the first connection line CNL1.

As described above, when the first conductive pattern BML1 is connected to the first source region SE1 of the first transistor T1, a swing width margin of the second driving power source ELVSS can be secured. The driving range of a gate voltage applied to the first gate electrode GE1 of the first transistor T1 can be widened.

The second transistor T2 (e.g. switching transistor) may include a second gate electrode GE2, a second active pattern ACT2, the second source region SE2, and a second drain region DE2.

The second electrode GE2 may be integrally provided with the first scan line Si and may be connected to the first scan line Si. The second gate electrode GE2 may be provided as a portion of the first scan line Si or be provided in a shape protruding from the first scan line Si.

Each of the second active pattern ACT2, the second source region SE2, and the second drain region DE2 may be a semiconductor pattern made of poly-silicon, amorphous silicon, oxide semiconductor, etc. In an example, the second active pattern ACT2, the second source region SE2, and the second drain region DE2 may be formed of an oxide semiconductor undoped or doped with an impurity. The second active pattern ACT2, the second source region SE2, and the second drain region DE2 may be formed of an oxide semiconductor having a thickness of about 300 Å to about 600 Å.

The second active pattern ACT2, the second source region SE2, and the second drain region DE2 may be disposed on the second interlayer insulating layer ILD2.

The second active pattern ACT2 is a region overlapping the second gate electrode GE2, and may be a channel region of the second transistor T2.

The second source region SE2 may be connected to one end of the second active pattern ACT2. Also, the second source region SE2 may be connected to the first gate electrode GE1 of the first transistor T1 through the fourth connection line CNL4.

The second drain region DE2 may be connected to the other end of the second active pattern ACT2. Also, the second drain region DE2 may be connected to the data line DLj through a sixth contact hole CH6 sequentially penetrating the second gate insulating layer GI2 and the third interlayer insulating layer ILD3. Therefore, a data voltage (or data signal) supplied to the data line DLj when the second transistor T2 is turned on may be transferred to the second drain region DE2.

A second conductive pattern BML2 may be disposed between the second transistor T2 and the substrate SUB. The second conductive pattern BML2 may overlap the second transistor T2 when viewed on a plane. The second conductive pattern BML2 may be disposed in the same layer as the first conductive pattern BML1 and may include the same material as the first conductive pattern BML1. In an example, the second conductive pattern BML2 may be disposed between the first interlayer insulating layer ILD1 and the second interlayer insulating layer ILD2. The second conductive pattern BML2 may be connected to a second connection line CNL2 through a fourth contact hole CH4.

The second connection line CNL2 may correspond to the fourth conductive layer disposed and/or formed on the third interlayer insulating layer ILD3. The second connection line CNL2 may be connected to the second conductive pattern BML2 through the fourth contact hole CH4, sequentially penetrating the second interlayer insulating layer ILD2, the second gate insulating layer GI2, and the third interlayer insulating layer ILD3. Also, the second connection line CNL2 may be connected to the second gate electrode GE2 of the second transistor T2 through a fifth contact hole CH5 penetrating the third interlayer insulating layer ILD3.

In an embodiment of the present disclosure, the second connection line CNL2 may be connected to the second conductive pattern BML2 through the fourth contact hole CH4, and may be connected to the second gate electrode GE2 through the fifth contact hole CH5. Consequently, the second gate electrode GE2 may be connected to the second conductive pattern BML2 through the second connection line CNL2.

As described above, when the second conductive pattern BML2 is connected to the second gate electrode GE2 of the second transistor T2, a voltage having the same level as a voltage supplied to the second gate electrode GE2 may be transferred to the second conductive pattern BML2. When the second conductive pattern BML2 is connected to the second gate electrode GE2 of the second transistor T2, a gate voltage of the first transistor T1 can be charged as the driving transistor.

The third transistor T3 may include a third gate electrode GE3, a third active pattern ACT3, the third source region SE3, and a third drain region DE3.

The third gate electrode GE3 may be integrally provided with the second scan line Si+1, and may be connected to the second scan line Si+1. The third gate electrode GE3 may be provided as a portion of the second scan line Si+1 or may be provided in a shape protruding from the second scan line Si+1.

Each of the third active pattern ACT3, the third source region SE3, and the third drain region DE3 may be a semiconductor pattern made of poly-silicon, amorphous silicon, oxide semiconductor, etc. In an example, the third active pattern ACT3, the third source region SE3, and the third drain region DE3 may be formed of an oxide semiconductor undoped or doped with an impurity. The third active pattern ACT3, the third source region SE3, and the third drain region DE3 may be formed of an oxide semiconductor having a thickness of about 300 Å to about 600 Å.

The third active pattern ACT3, the third source region SE3, and the third drain region DE3 may be disposed on the second interlayer insulating layer ILD2.

The third active pattern ACT3 is a region overlapping the third gate electrode GE3, and may be a channel region of the third transistor T3.

The third source region SE3 may be connected to one end of the third active pattern ACT3. Also, the third source region SE3 may be connected to the first source region SE1 of the first transistor T1.

The third drain region DE3 may be connected to the other end of the third active pattern ACT3. Also, the third drain region DE3 may be connected to the reference voltage line RFj through a seventh contact hole CH7 sequentially penetrating the second gate insulating layer GI2 and the third interlayer insulating layer ILD3.

A third conductive pattern BML3 may be disposed between the third transistor T3 and the substrate SUB. The third conductive pattern BML3 may correspond to the second conductive layer disposed on the first interlayer insulating layer ILD1. The third conductive pattern BML3 may be disposed in the same layer as the first and second conductive patterns BML1 and BML2.

The third conductive pattern BML3 may be connected to a third connection line CNL3 through a ninth contact hole CH9 sequentially penetrating the second interlayer insulating layer ILD2, the second gate insulating layer GI2, and the third interlayer insulating layer ILD3.

The third connection line CNL3 may correspond to the fourth conductive layer disposed on the third interlayer insulating layer ILD3. The third connection line CNL3 may be connected to the third gate electrode GE3 of the third transistor T3 through an eighth contact hole CH8 penetrating the third interlayer insulating layer ILD3.

In an embodiment of the present disclosure, the third connection line CNL3 may be connected to the third gate electrode GE3 of the third transistor T3 through the eighth contact hole CH8, and may be connected to the third conductive pattern BML3 through the ninth contact hole CH9. Consequently, the third gate electrode GE3 of the third transistor T3 may be connected to the third conductive pattern BmL3 through the third connection line CNL3.

As described above, when the third conductive pattern BML3 is connected to the third gate electrode GE3 of the third transistor T3, a voltage having the same level as a voltage supplied to the third gate electrode GE3 may be transferred to the third conductive pattern BML3. When the third conductive pattern BML3 is connected to the third gate electrode GE3 of the third transistor T3, an on-current Ion is increased, and thus an electrical characteristic of the third transistor T3 can be enhanced.

The fourth transistor T4 may include a fourth gate electrode GE4, a fourth active patter ACT4, a fourth source region SE4, and the fourth drain region DE4.

The fourth gate electrode GE4 may be connected to the emission control line Ei. The fourth gate electrode GE4 may be integrally provided with the emission control line Ei and may be connected to the emission control line Ei. The fourth gate electrode GE4 may be provided as a portion of the emission control line Ei or be provided in a shape protruding from the emission control line Ei.

The fourth active pattern ACT4, the fourth source region SE4, and the fourth drain region DE4 may be disposed on the buffer layer BFL.

The fourth active pattern ACT4, the fourth source region SE4, and the fourth drain region DE4 may be formed of a poly-silicon semiconductor layer undoped or doped with an impurity. In an example, the fourth source region SE4 and the fourth drain region DE4 may be formed of a poly-silicon semiconductor layer doped with the impurity, and the fourth active pattern ACT4 may be formed of a poly-silicon semiconductor layer undoped with the impurity.

The fourth active pattern ACT4 is a region overlapping the fourth gate electrode GE4, and may be a channel region of the fourth transistor T4.

The fourth source region SE4 may be connected to one end of the fourth active pattern ACT4. Also, the fourth source region SE4 may be connected to the power line PL through a third contact hole CH3 sequentially penetrating the first gate insulating layer GI1, the first and second interlayer insulating layers ILD1 and ILD2, the second gate insulating layer GI2, and the third interlayer insulating layer ILD3.

The fourth drain region DE4 may be connected to the other end of the fourth active pattern ACT4. Also, the fourth drain region DE4 may be connected to the first drain region DE1 of the first transistor T1 through the tenth contact hole CH10, the fifth connection line CNL5, and the eleventh contact hole CH11.

The storage capacitor Cst may include a lower electrode LE and an upper electrode UE.

The lower electrode LE may be integrally provided with the first conductive pattern BML1 overlapping the first transistor T1. When the lower electrode LE is integrally provided with the first conductive pattern BML1, the lower electrode LE may be considered as one region of the first conductive pattern BML1.

The upper electrode UE may be disposed on the lower electrode LE to overlap the lower electrode LE. An overlapping area of the upper electrode UE and the lower electrode LE is widened, so that the capacitance of the storage capacitor Cst can be increased. The upper electrode UE may be integrally provided with the first gate electrode GE1 of the first transistor T1. When the upper electrode UE is integrally provided with the first gate electrode GE1, the upper electrode UE may be considered as one region of the first gate electrode GE. Therefore, the upper electrode UE may be electrically connected to the second source region SE2 of the second transistor T2 through the first contact hole CH1, the fourth connection line CNL4, and the second contact hole CH2.

The passivation layer PSV may be disposed over components corresponding to the fourth conductive layer, e.g., the reference voltage line RFj, the data line DLj, the power line PL, and the first to fifth connection lines CNL1 to CNL5.

The passivation layer PSV may be provided in a form including an organic insulating layer, an inorganic insulating layer, or the organic insulating layer disposed on the inorganic insulating layer. The inorganic insulating layer may include silicon nitride (SiNx), silicon oxide (SiOx), silicon oxynitride (SiOxNy), and/or metal oxide such as aluminum oxide (AlOx). The organic insulating layer may include an organic insulating material which enables light to be transmitted therethrough. The organic insulating layer may include, for example, polyacrylates resin, epoxy resin, phenolic resin, polyamides resin, polyimides resin, unsaturated polyesters resin, poly-phenylene ethers resin, poly-phenylene sulfides resin, and/or benzocyclobutenes resin. In an embodiment of the present disclosure, the passivation layer PSV may include an organic insulating layer which may assist in effective planarization, e.g., polyimides resin, and may have a thickness of about 16000 Å. However, the present disclosure is not necessarily limited thereto.

Next, the display element layer DPL will be described.

The display element layer DPL may include the light emitting element OLED and a pixel defining layer PDL.

The light emitting element OLED may include a first electrode AE, a second electrode CE, and an emitting layer EML disposed between the two electrodes AE and CE. Any one of the first and second electrodes AE and CE may be an anode electrode, and the other of the first and second electrodes AE and CE may be a cathode electrode. When the light emitting element OLED is a top-emission organic light emitting element, the first electrode AE may be a reflective electrode, and the second electrode CE may be a transmissive electrode. In an embodiment of the present disclosure, a case where the light emitting element OLED is the top-emission organic light emitting element, and the first electrode AE is the anode electrode is described as an example.

The first electrode AE may be disposed and/or formed on the passivation layer PSV. The first electrode AE may be connected to the first connection line CNL1 through a fourteenth contact hole CH14 penetrating the first electrode AE. Accordingly, the first electrode AE may be connected to the first source region SE1 of the first transistor T1 and the third source region SE3 of the third transistor T3 through the first connection line CNL1. The first electrode AE may include a reflective layer capable of at least partially reflecting light and a transparent conductive layer disposed on the top or bottom of the reflective layer. In an example, the first electrode AE may be provided in a multi-layer structure including a lower transparent conductive layer made of indium tin oxide (ITO), a reflective layer which is disposed on the lower transparent conductive layer and is made of silver (Ag), and an upper transparent conductive layer which is disposed on the reflective layer and is made of indium tin oxide (ITO). The lower transparent conductive layer may have a thickness of about 50 Å, the reflective layer may have a thickness of about 850 Å, and the upper transparent conductive layer may have a thickness of about 70 Å. At least one of the lower transparent conductive layer, the reflective layer, and the upper transparent conductive layer, which are described above, may be connected to each of the first source region SE1 of the first transistor T1 and the third source region SE3 of the third transistor T3.

Although a case where the first electrode AE is configured as a multi-layer structure in which ITO/Ag/ITO are sequentially stacked has been described in the above-described embodiment, the present disclosure is not necessarily limited thereto. In some embodiments, the first electrode AE may be configured as a single layer made of a transparent metal oxide such as Indium Tin Oxide (ITO).

The pixel defining layer PDL may be disposed over the first electrode AE. The pixel defining layer PDL may have an opening exposing a portion of the first electrode AE1, e.g., a top surface of the first electrode AE1. The pixel defining layer PDL may be an organic insulating layer including an organic material. In an example, the pixel defining layer PDL may be made of polyimides resin, and have a thickness of about 15000 Å to about 16000 Å. However, the present disclosure is not necessarily limited thereto.

The emitting layer EML may be disposed on the top surface of the first electrode AE, which is exposed by the opening. The second electrode CE may be disposed on the emitting layer EML.

The emitting layer EML may be disposed on the top surface of the first electrode AE. The emitting layer EML may have a multi-layered thin film structure including at least a light generation layer. The emitting layer EML may include a hole injection layer for injecting holes, a hole transport layer having an excellent hole transporting property, the hole transport layer for increasing the opportunity for holes and electrons to be re-combined by suppressing the movement of electrons that fail to be combined in the light generation layer, the light generation layer for emitting light through the re-combination of the injected electrons and holes, a hole blocking layer for suppressing the movement of holes that fail to be combined in the light generation layer, an electron transport layer smoothly transporting electrons to the light generation layer, and an electron injection layer for injecting electrons.

The color of light generated in the light generation layer may be one of red, green, blue, and white, but the present disclosure is not necessarily limited thereto. For example, the color of light generated in the light generation layer may also be one of magenta, cyan, and yellow. The hole injection layer, the hole transport layer, the hole blocking layer, the electron transport layer, and the electron injection layer may be common layers connected in light emitting areas adjacent to each other.

A thin film encapsulation TFE covering the second electrode EL2 may be disposed over the second electrode EL2.

The thin film encapsulation TFE may be provided as a single layer, but may alternatively be provided as a multi-layer structure. The thin film encapsulation TFE may include a plurality of insulating layers covering the light emitting element OLED. For example, the thin film encapsulation TFE may include at least one inorganic layer and at least one organic layer. For example, the thin film encapsulation TFE may have a structure in which inorganic and organic layers are alternately stacked. In some embodiments, the thin film encapsulation TFE may be an encapsulation substrate which is disposed over the light emitting element OLED and is joined with the substrate through a sealant.

Meanwhile, the display device, in accordance with the embodiment of the present disclosure, may include a touch sensor disposed on the thin film encapsulation TFE. The touch sensor may be disposed on a surface in a direction in which an image of the substrate SUB is emitted, to receive a touch input of a user. The touch sensor may recognize a touch event to the display device through a hand of the user or a separate input means.

In accordance with the above-described embodiment, in each pixel PXL, the first to third transistors T1 to T3 among the transistors included in the pixel circuit PXC are implemented with an oxide transistor, so that a leakage current can be minimized. Accordingly, a characteristic of each element is enhanced, and thus a high-resolution display device can more be easily implemented.

Also, in accordance with the above-described embodiment, the first to third conductive patterns BML1, BML2, and BLM3 are disposed between the first to third transistors T1 to T3 implemented with the oxide transistor, so that element characteristics of the first to third transistors T1 to T3 can be prevented from being changed by light introduced to a rear surface of the substrate SUB.

Also, in accordance with the above-described embodiment, when the first conductive pattern BML1 and the first source region SE1 of the first transistor T1 are connected to each other, the first transistor T1 performs a drain synchronization operation in an initialization period (or reset period), so that it can be beneficial to reduce the initialization period. Further, the swing width margin of the second driving power source ELVSS is secured, so that the driving range of the gate voltage applied to the first gate electrode GE1 of the first transistor T1 can be widened.

Additionally, as described above, the first conductive pattern BML1 is used as one electrode, e.g., the lower electrode LE of the storage capacitor Cst, so that a space in which the storage capacitor Cst can be formed within a narrow space of the pixel area PXA can be sufficiently secured. Accordingly, a display device capable of easily implementing high resolution can be provided.

Figure 7:
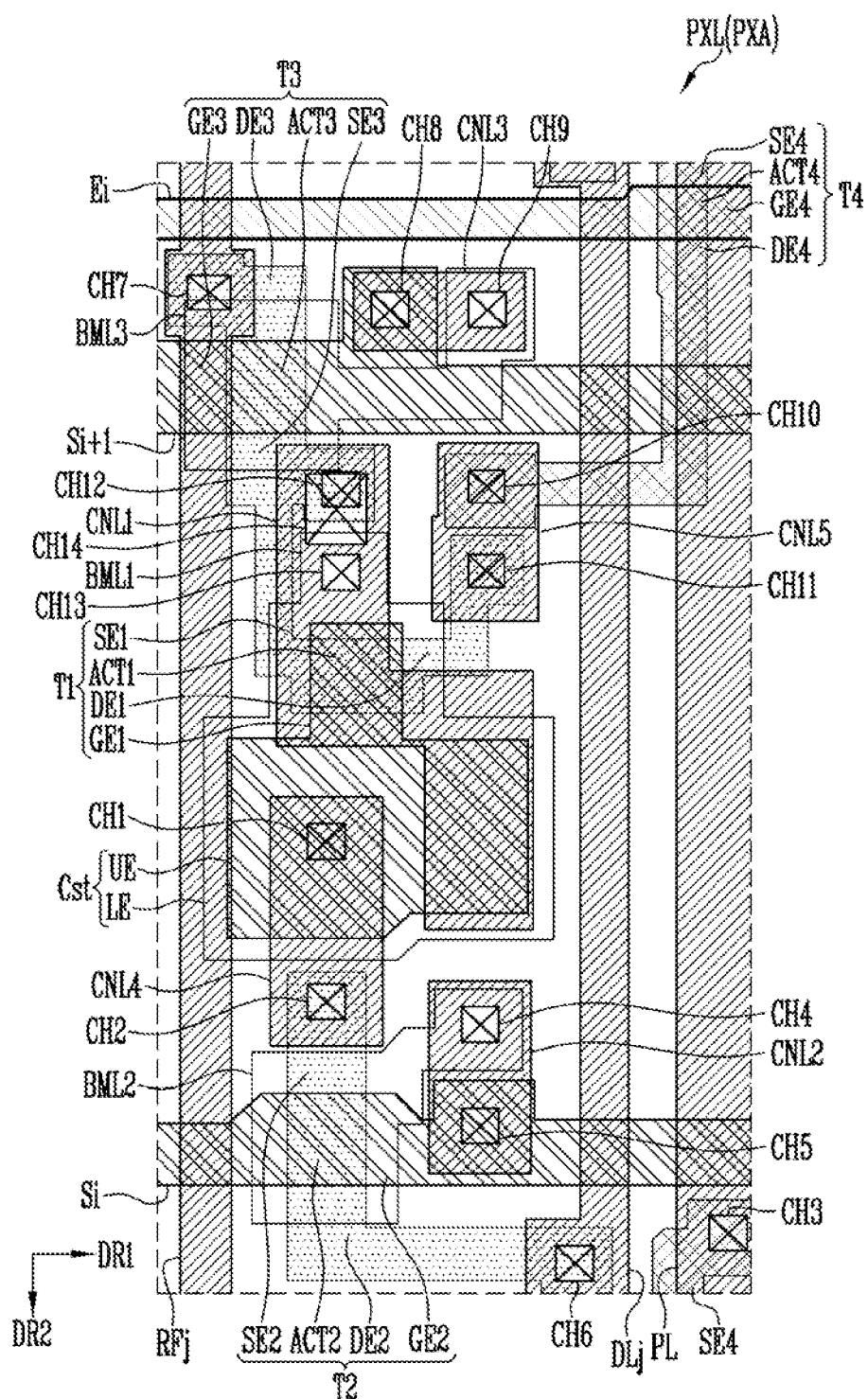
FIG. 7 is a plan view schematically illustrating one pixel in accordance with an embodiment of the present disclosure.

FIG. 7 is a plan view schematically illustrating one pixel in accordance with an embodiment of the present disclosure.

In FIG. 7, illustration of a light emitting element OLED connected to first and third transistors T1 and T3 is omitted for convenience but it is to be understood that this elements is still present in the illustrated embodiment.

The pixel shown in FIG. 7 has a configuration substantially similar to the pixel shown in FIG. 4, except that a data line DLj is disposed closer to a power line PL than a reference voltage line RFj is to the power line PL. In FIG. 7, portions different from those of the above-described embodiment will be mainly described to avoid redundancy. Portions not particularly described in the embodiment shown in FIG. 7 follow those of the above-described embodiment. In addition, identical reference numerals may refer to identical components, and similar reference numerals may refer to similar components.

Referring to FIGS. 1 to 3 and 7, each pixel PXL may be disposed in a pixel area PXA included in the display area DA of the substrate SUB.

Scan lines Si and Si+1, an emission control line Ei, the reference voltage line RFj, the data line DLj, and the power line PL, which are connected to a pixel circuit PXC, may be disposed in the pixel area PXA.

The reference voltage line RFj, the power line PL, and the data line DLj may be provided in a shape extending along the second direction DR2. Also, the reference voltage line RFj, the power line PL, and the data line DLj may be arranged along the first direction DR1, and may be spaced apart from each other. In an embodiment of the present disclosure, the reference voltage line RFj, the power line PL, and the data line DLj may be disposed on the third interlayer insulating layer (see ILD3 shown in FIG. 5), and may be spaced apart from each other.

The reference voltage line RFj may be disposed at one side of the data line DLj and may be spaced apart from the data line DLj at a certain distance, and the power line PL may be disposed at the other side of the data line DLj and may be spaced apart from the data line DLj at a certain distance. In an example, the distance between the data line DLj and the reference voltage line RFj may be different from that between the data line DLj and the power line PL. In an example, the distance between the data line DLj and the power line PL may be narrower than that between the data line DLj and the reference voltage line RFj. The data line DLj may be disposed closer to the power line PL than the reference voltage line RFj is to the power line PL.

When viewed on a plane, the first to third transistors T1 to T3 and a storage capacitor Cst, which are included in the pixel circuit PXC, may be disposed between the reference voltage line RFj and the data line DLj. In an embodiment of the present disclosure, when viewed on a plane, the reference voltage line RFj and the data line DLj may be spaced apart from each other with some components included in the pixel circuit PXC, which are interposed therebetween.

As described above, when the data line DLj is disposed closer to the power line PL than the reference voltage line RFj is to the power line, a distance between a gate electrode GE1 of the first transistor T1 and the data line DLj can be further secured, as compared with the pixel shown in FIG. 4. Accordingly, crosstalk can be prevented by blocking vertical capacitive coupling (e.g., a parasitic capacitor) formed between the gate electrode GE1 of the first transistor T1 and the data line DLj.

Figure 8:
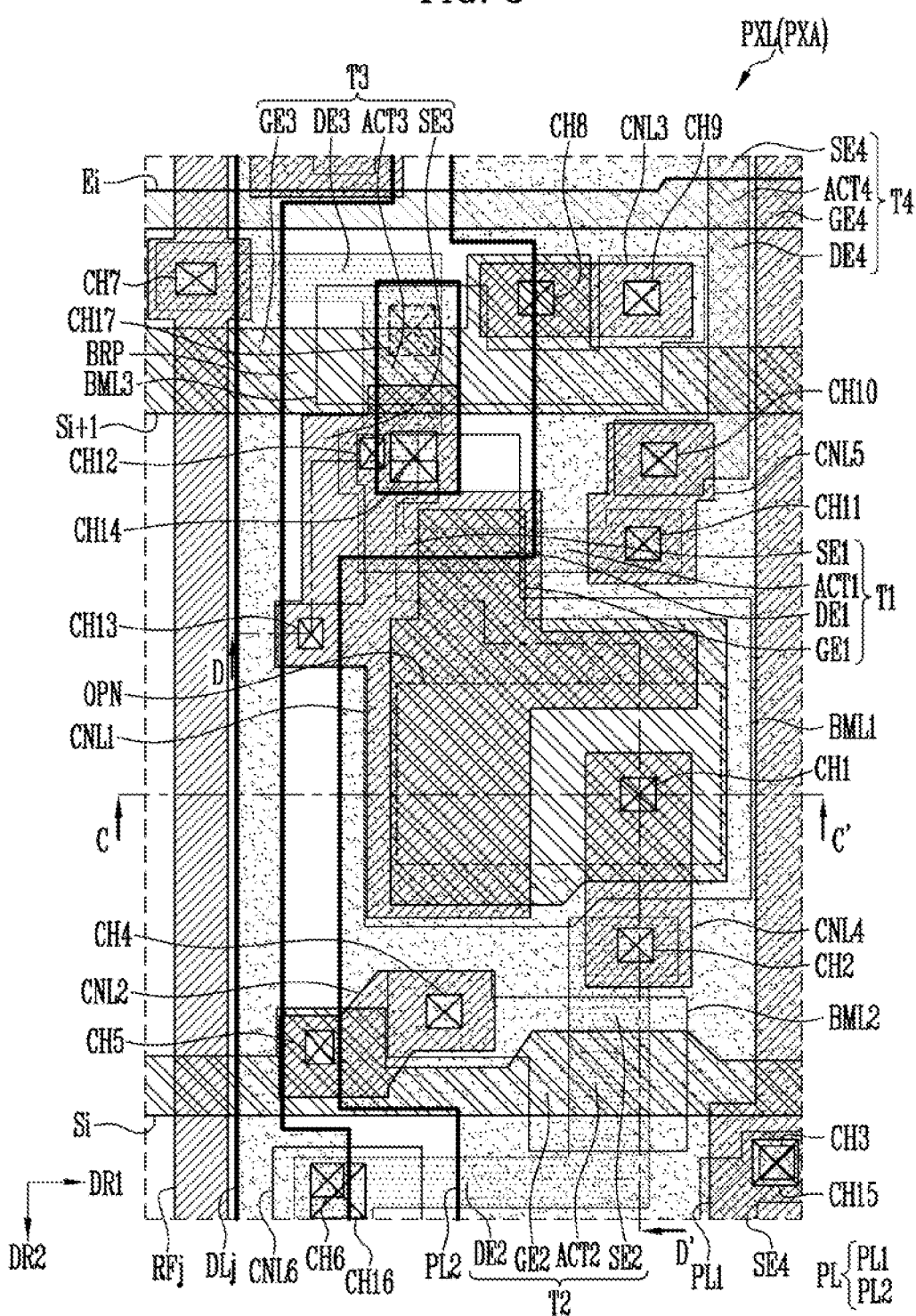
FIG. 8 is a plan view schematically illustrating one pixel in accordance with an embodiment of the present disclosure.
Figure 9:
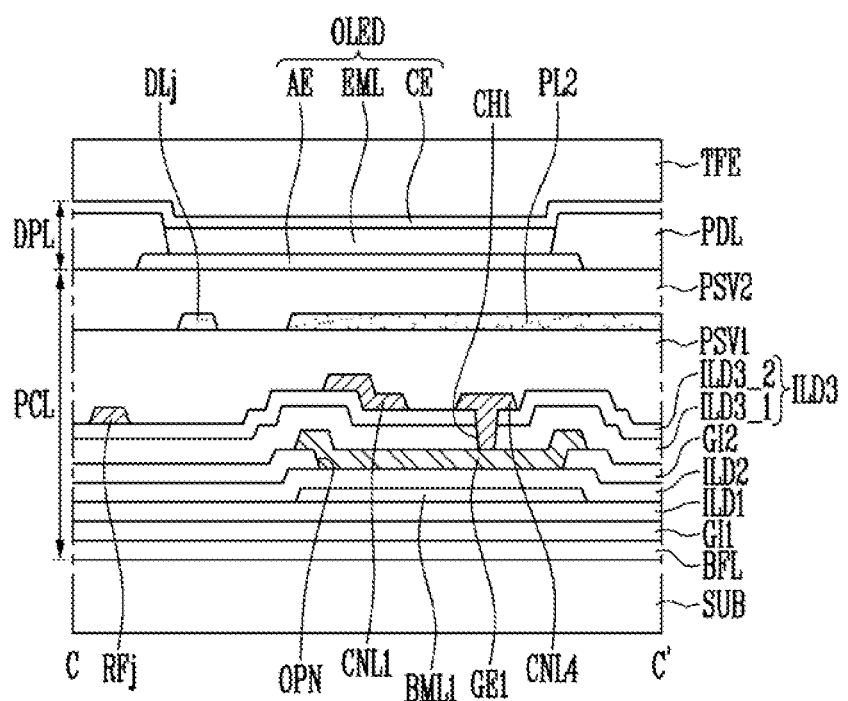
FIG. 9 is a cross-sectional view taken along line C-C' shown in FIG. 8.
Figure 10:
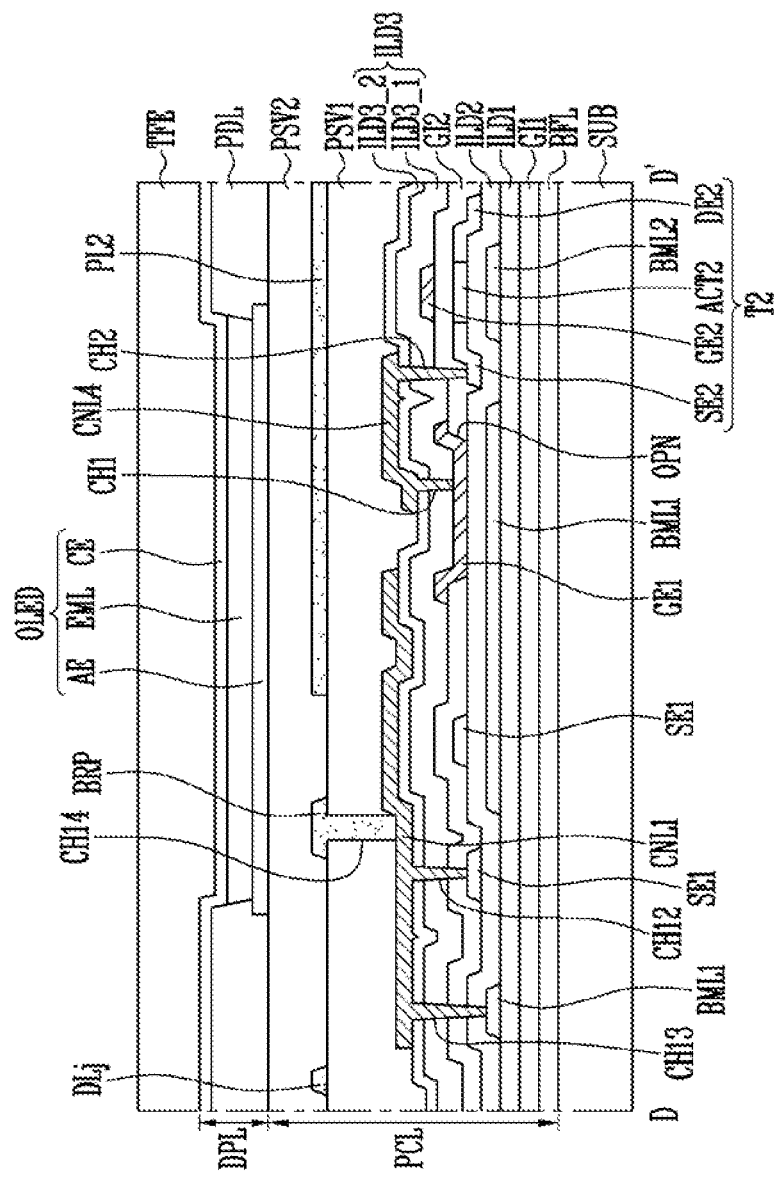
FIG. 10 is a cross-sectional view taken along line D-D' shown in FIG. 8.

FIG. 8 is a plan view schematically illustrating one pixel in accordance with an embodiment of the present disclosure. FIG. 9 is a cross-sectional view taken along line C-C' shown in FIG. 8. FIG. 10 is a cross-sectional view taken along line D-D' shown in FIG. 8.

In FIG. 8, illustration of a light emitting element OLED connected to first and third transistors T1 and T3 is omitted for convenience but it is to be understood that this element is still present in the illustrated embodiment.

The pixel shown in FIGS. 8 to 10 has a configuration substantially similar to the pixel shown in FIG. 4, except that a data line DLj and a power line PL are disposed in a layer different from that of a reference voltage line RFj, and the first and third transistors T1 and T3 is electrically connected to the light emitting element OLED through a bridge pattern BRP.

In FIG. 8, portions different from those of the above-described embodiment will be mainly described to avoid redundancy. Portions not particularly described in the embodiment shown in FIGS. 8 to 10 follow those of the above-described embodiment. In addition, identical reference numerals may refer to identical components, and similar reference numerals may refer to similar components.

Referring to FIGS. 1 to 3 and 8 to 10, the display device in accordance with the embodiment of the present disclosure may include a substrate SUB, a line unit, and pixels PXL.

A buffer layer BFL, a first gate insulating layer GI1, first and second interlayer insulating layers ILD1 and ILD2, a second gate insulating layer GI2, a third interlayer insulating layer ILD3, a first passivation layer PSV1, and a second passivation layer PSV2 may be sequentially stacked on the substrate SUB. Also, a plurality of conductive layers disposed and/or formed between the above-described insulating layers may be disposed and/or formed on the substrate SUB.

In an embodiment of the present disclosure, the conductive layers may include, for example, a first conductive layer disposed on the first gate insulating layer GI1, a second conductive layer disposed on the first interlayer insulating layer ILD1, a third conductive layer disposed on the second gate insulating layer GI2, a fourth conductive layer disposed on the third interlayer insulating layer ILD3, and a fifth conductive layer disposed on the first passivation layer PSV1.

Each pixel PXL may be disposed in a pixel area PXA included in the display area DA of the substrate SUB.

First and second scan lines Si and Si+1, an emission control line Ei, the data line DLj, the reference voltage line RFj, and the power line PL may be disposed in the pixel area PXA.

When viewed on a plane, the first and second scan lines Si and Si+1 and the emission control line Ei may extend in the first direction DR1, and may be arranged along the second direction DR2. The first and second scan lines Si and Si+1 and the emission control line Ei may be disposed in different layers. In an example, the first and second scan lines Si and Si+1 may be disposed on the second gate insulating layer GI2, and the emission control line Ei may be disposed on the first gate insulating layer GI1. In an embodiment of the present disclosure, the first and second scan lines Si and Si+1 may correspond to the third conductive layer, and the emission control line Ei may be first conductive layer.

In an embodiment of the present disclosure, the power line PL may include a first power line PL1 and a second power line PL2. The first and second power lines PL1 and PL2 may extend primarily along the second direction DR2. The first power line PL1 may be disposed and/or formed on the third interlayer insulating layer ILD3, and the second power line PL2 may be disposed and/or formed on the first passivation layer PSV1. The first power line PL1 may correspond to the fourth conductive layer, and the second power line PL2 may correspond to the fifth conductive layer. The first passivation layer PSV1 may be the same component as the passivation layer PSV described with reference to FIGS. 4 to 6.

The first power line PL1 and the second power line PL2 may be connected to each other through a fifteenth contact hole CH15 penetrating the third interlayer insulating layer ILD3.

When viewed on a plane, the reference voltage line RFj, the data line DLj, and the power line PL may extend primarily along the second direction DR2, and may be sequentially arranged along the first direction DR1.

The reference voltage line RFj and the first power line PL1 may be disposed and/or formed in the same layer, and the data line DLj and the second power line PL2 may be disposed and/or formed in the same layer. In an example, the reference voltage line RFj may be disposed on the third interlayer insulating layer ILD3, and the data line DLj may be disposed on the first passivation layer PSV1. In an embodiment of the present disclosure, the reference voltage line RFj may correspond to the fourth conductive layer, and the data line DLj may correspond to the fifth conductive layer.

Each of the pixels PXL may include a pixel circuit layer PCL having a pixel circuit PXC and a display element layer DPL having a light emitting element OLED.

In an embodiment of the present disclosure, the pixel circuit layer PCL may include the buffer layer BFL disposed on the substrate SUB, the pixel circuit PXC disposed on the buffer layer BFL, and the first and second passivation layers PSV1 and PSV2 disposed over the pixel circuit PXC.

The pixel circuit PXC may include first to fourth transistors T1 to T4 and a storage capacitor Cst. Also, the pixel circuit PXC may include a first conductive pattern BML1 connected to the first transistor T1, a second conductive pattern BML2 connected to the second transistor T2, and a third conductive pattern BML3 connected to the third transistor T3.

Among the first to fourth transistors T1 to T4, the first to third transistors T1 to T3 may be implemented with an oxide transistor, and the fourth transistor T4 may be implemented with a poly-silicon transistor.

The first transistor T1 may include a first gate electrode GE1, a first active pattern ACT1, a first source region SE1, and a first drain region DE1. The first conductive pattern BML1 may be disposed under the first transistor T1.

The first conductive pattern BML1 may overlap the first transistor T1. In an example, the first conductive pattern BML1 may be disposed under the first gate electrode GE1 to overlap the first gate electrode GE1.

The first gate electrode GE1 may correspond to the third conductive layer disposed on the second gate insulating layer GI2. The first gate electrode GE1 may overlap the first conductive pattern BML1 with at least one insulating layer interposed therebetween. In an example, the first gate electrode GE1 may overlap the first conductive pattern BML1 with the second interlayer insulating layer ILD2 and the second gate insulating layer GI2, which are interposed therebetween. Accordingly, a capacitance caused by capacitive coupling can be formed between the first gate electrode GE1 and the first conductive pattern BML1.

In some embodiments, an opening OPN formed by removing a portion of the second gate insulating layer GI2 may be disposed between the first gate electrode GE1 and the first conductive pattern BML1. The opening OPN may be formed by removing a partial insulating layer disposed in a region in which the first gate electrode GE1 and the first conductive pattern BML1 overlap each other, e.g., a portion of the second gate insulating layer GI2. As shown in FIGS. 9 and 10, only the second interlayer insulating layer ILD2 may be disposed between the first gate electrode GE1 and the first conductive pattern BML1 due to the opening formed by removing the portion of the second gate insulating layer GI2, which is disposed between the first gate electrode GE1 and the first conductive pattern BML1.

When only the second interlayer insulating layer ILD2 is disposed between the first gate electrode GE1 and the first conductive pattern BML1, a distance between the first gate electrode GE1 and the first conductive pattern BML1 may be narrowed, as compared with a case where the second interlayer insulating layer ILD2 and the second gate insulating layer GI2 are sequentially disposed between the first gate electrode GE1 and the first conductive pattern BML1. Accordingly, the capacitance caused by the capacitive coupling formed between the first gate electrode GE1 and the first conductive pattern BML1 can be further increased.

In addition, a first connection line CNL1 may be disposed on the area in which the first gate electrode GE1 and the first conductive pattern BML1 overlap each other. The first connection line CNL1 may be disposed on the third interlayer insulating layer ILD3, and may overlap the first gate electrode GE1 with the third interlayer insulating layer ILD3 interposed therebetween. Accordingly, a capacitance caused by capacitive coupling can be formed between the first gate electrode GE1 and the first connection line CNL1.

As described above, a capacitance may be formed between the first conductive pattern BML1 and the first gate electrode GE1 with the second interlayer insulating layer ILD2 interposed therebetween, and a capacitance may be formed between the first gate electrode GE1 and the first connection line CNL1 with the third interlayer insulating layer ILD3 interposed therebetween. In an embodiment of the present disclosure, the first conductive pattern BML1 may be a first storage electrode which constitutes the storage capacitor Cst, the first gate electrode GE1 may be a second storage electrode which constitutes the storage capacitor Cst, and the first connection line CNL1 may be a third storage electrode which constitutes the storage capacitor Cst.

The first source region SE1 of the first transistor T1 may be connected to the first conductive pattern BML1 through a twelfth contact hole CH12, the first connection line CNL1, and a thirteenth contact hole CH13. In an example, the first source region SE1 may be connected to the first connection line CNL1 through the twelfth contact hole CH12 sequentially penetrating the second gate insulating layer GI2 and the third interlayer insulating layer ILD3, and the first connection line CNL1 may be connected to the first conductive pattern BML1 through the thirteenth contact hole CH13 sequentially penetrating the second interlayer insulating layer ILD2, the second gate insulating layer GI2, and the third interlayer insulating layer ILD3. Accordingly, the first source region SE1 may be connected to the first conductive pattern BML1 through the twelfth contact hole CH12, the first connection line CNL1, and the thirteenth contact hole CH13.

The first drain region DE1 of the first transistor T1 may be connected to a fourth drain region DE4 of the fourth transistor T4 through an eleventh contact hole CH11, a fifth connection line CNL5, and a tenth contact hole CH10.

The tenth to thirteenth contact holes CH10 to CH13 may be components substantially identical to the tenth to thirteenth contact holes CH10 to CH13 described with reference to FIGS. 4 to 6.

The first passivation layer PSV1 may be disposed over the first connection line CNL1. The bridge pattern BRP may be disposed on the first passivation layer PSV1. In an embodiment of the present disclosure, the bridge pattern BRP may be the fifth conductive pattern disposed on the first passivation layer PSV1. The bridge pattern BRP may be disposed in the same layer as the data line DLj and the second power line PL2, and may include the same material as the data line DLj and the second power line PL2. The bridge pattern BRP may be spaced apart from each of the data line DLj and the second power line PL2. The bridge pattern BRP may be connected to the first connection line CNL1 through a fourteenth contact hole CH14 penetrating the first passivation layer PSV1.

The second passivation layer PSV2 may be disposed over the bridge pattern BRP, the data line DLj, and the second power line PL2. The second passivation layer PSV2 may include the same material as the first passivation layer PSV1. In an example, the second passivation layer PSV may be an organic insulating layer including an organic material, which may assist in effective planarization. Polyimides resin may be selected as the organic insulating layer. The second passivation layer PSV2 may have a thickness of about 16000 Å, but the present disclosure is not necessarily limited thereto.

The bridge pattern BRP may be connected to a first electrode AE of the light emitting element OLED through a seventeenth contact hole CH17 penetrating the second passivation layer PSV2. Consequently, the first electrode AE may be connected to the source region SE1 of the first transistor T1 and a third source region SE3 of the third transistor T3 through the bridge pattern BRP and the first connection line CNL1.

The fourteenth contact hole CH14 and the seventeenth contact hole CH17, which are described above, may have a size relatively larger than that of an inorganic insulating layer made of an inorganic material, for example, due to material characteristics of the first passivation layer PSV1 and the second passivation layer PSV2. The fourteenth contact hole CH14 and the seventeenth contact hole CH17 may have a size (e.g. area) greater than that of first to thirteenth contact holes CH1 to CH13, and fifteenth and sixteenth contact holes CH15 and CH16.

The second transistor T2 may include a second gate electrode GE2, a second active pattern ACT2, a second source region SE2, and a second drain region DE2. The second conductive pattern BML2 may be disposed under the second transistor T2.

The second gate electrode GE2 may be integrally provided with the first scan line Si, and the second active pattern ACT2 may overlap the second gate electrode GE2.

The second source region SE2 may be connected to one end of the second active pattern ACT2. Also, the second source region SE2 may be connected to the first gate electrode GE1 of the first transistor T1 through the second contact hole CH2, a fourth connection line CNL4, and the first contact hole CH1. The first and second contact holes CH1 and CH2 may be components substantially identical to the first and second contact holes CH1 and CH2 described with reference to FIGS. 4 to 6.

The second drain region DE2 may be connected to the other end of the second active pattern ACT2. Also, the second drain region DE2 may be connected to a sixth connection line CNL6 through the sixth contact hole CH6 sequentially penetrating the second gate insulating layer GI2 and the third interlayer insulating layer ILD3. The sixth contact hole CH6 may be a component substantially identical to the sixth contact hole CH6 described with reference to FIGS. 4 to 6.

The sixth connection line CNL6 may be connected to the data line DLj through the sixteenth contact hole CH16 penetrating the first passivation layer PSV1. Accordingly, the second drain region DE2 may be connected to the data line DLj through the sixth contact hole CH6, the sixth connection line CNL6, and the sixteenth contact hole CH16. Therefore, when the second transistor T2 is turned on, a data voltage (or data signal) supplied to the data line DLj may be transferred to the second drain region DE2.

The second conductive pattern BML2 may be connected to the second gate electrode GE2 of the second transistor T2 through the fourth contact hole CH4, a second connection line CNL2, and a fifth contact hole CH5. The fourth and fifth contact holes CH4 and CH5 may be components substantially identical to the fourth and fifth contact holes CH4 and CH5 described with reference to FIGS. 4 to 6.

The third transistor T3 may include a third gate electrode GE3, a third active pattern ACT3, the third source region SE3, and a third drain region DE3. The third conductive pattern BML3 may be disposed under the third transistor T3.

The third gate electrode GE3 may be integrally provided with the second scan line Si+1, and the third active pattern ACT3 may overlap the third gate electrode GE3.

The third source region SE3 may be connected to one end of the third active pattern ACT3 and the first source region SE1 of the first transistor T1.

The third drain region DE3 may be connected to the other end of the third active pattern ACT3. Also, the third drain region DE3 may be connected to the reference voltage line RFj through the seventh contact hole CH7. The seventh contact hole CH7 may be a component substantially identical to the seventh contact hole CH7 described with reference to FIGS. 4 to 6.

The third conductive pattern BML3 may be connected to the third gate electrode GE3 of the third transistor T3 through the ninth contact hole CH9, a third connection line CNL3, and the eighth contact hole CH8. The eighth and ninth contact holes CH8 and CH9 may be components substantially identical to the eighth and ninth contact holes CH8 and CH9 described with reference to FIGS. 4 to 6.

The fourth transistor T4 may include a fourth gate electrode GE4, a fourth active pattern ACT4, a fourth source region SE4, and the fourth drain region DE4.

The fourth gate electrode GE4 may be integrally provided with the emission control line Ei, the fourth active patter ACT4 may overlap the fourth gate electrode GE4.

The fourth source region SE4 may be connected to one end of the fourth active pattern ACT4. Also, the fourth source region SE4 may be connected to the first power line PL1 through the third contact hole CH3. The third contact hole CH3 may be a component substantially identical to the third contact hole CH3 described with reference to FIGS. 4 to 6.

The fourth drain region DE4 may be connected to the other end of the fourth active pattern ACT4. Also, the fourth drain region DE4 may be connected to the first drain region DE1 of the first transistor T1 through the tenth contact hole CH10, the fifth connection line CNL5, and the eleventh contact hole CH11.

Meanwhile, in an embodiment of the present disclosure, the power line PL may overlap a partial component of the pixel circuit PXC, e.g., a portion of the first transistor T when viewed on a plane, to cover the portion of the first transistor T1. As shown in FIG. 8, when a portion of the first transistor T1 is covered by expanding the second power line PL2 of the power line PL, the second power line PL2 may block vertical capacitive coupling formed between the data line DLj and the first gate electrode GE1 of the first transistor T1. Accordingly, crosstalk is prevented between the data line DLj and the first transistor T1, so that an image quality failure caused by the crosstalk can be reduced.

As described above, the capacitance can be further increased by the capacitive coupling formed between the first conductive pattern BML1 and the first gate electrode GE1 of the first transistor T1, which is caused by the opening OPN formed by removing a portion of the insulating layer disposed between the first conductive pattern BML1 and the first gate electrode GE1. Accordingly, the capacitance of the storage capacitor Cst in each pixel PXL can be further increased.

Also, as described above, the first transistor T1 is covered by expanding the power line, so that the vertical capacitive coupling formed between the data line DLj and the first gate electrode GE1 of the first transistor T1 can be blocked.

Additionally, as described above, the first conductive pattern BML1 is used as a first electrode of the storage capacitor Cst, the first gate electrode GE1 is used as a second electrode of the storage capacitor Cst, and the first connection line CNL1 as a third electrode of the storage capacitor Cst, so that a space in which the storage capacitor Cst can be formed within a narrow space of the pixel area PXA of each pixel PXL can be sufficiently secured. Accordingly, a display device capable of easily implementing high resolution can be provided.

Figure 11:
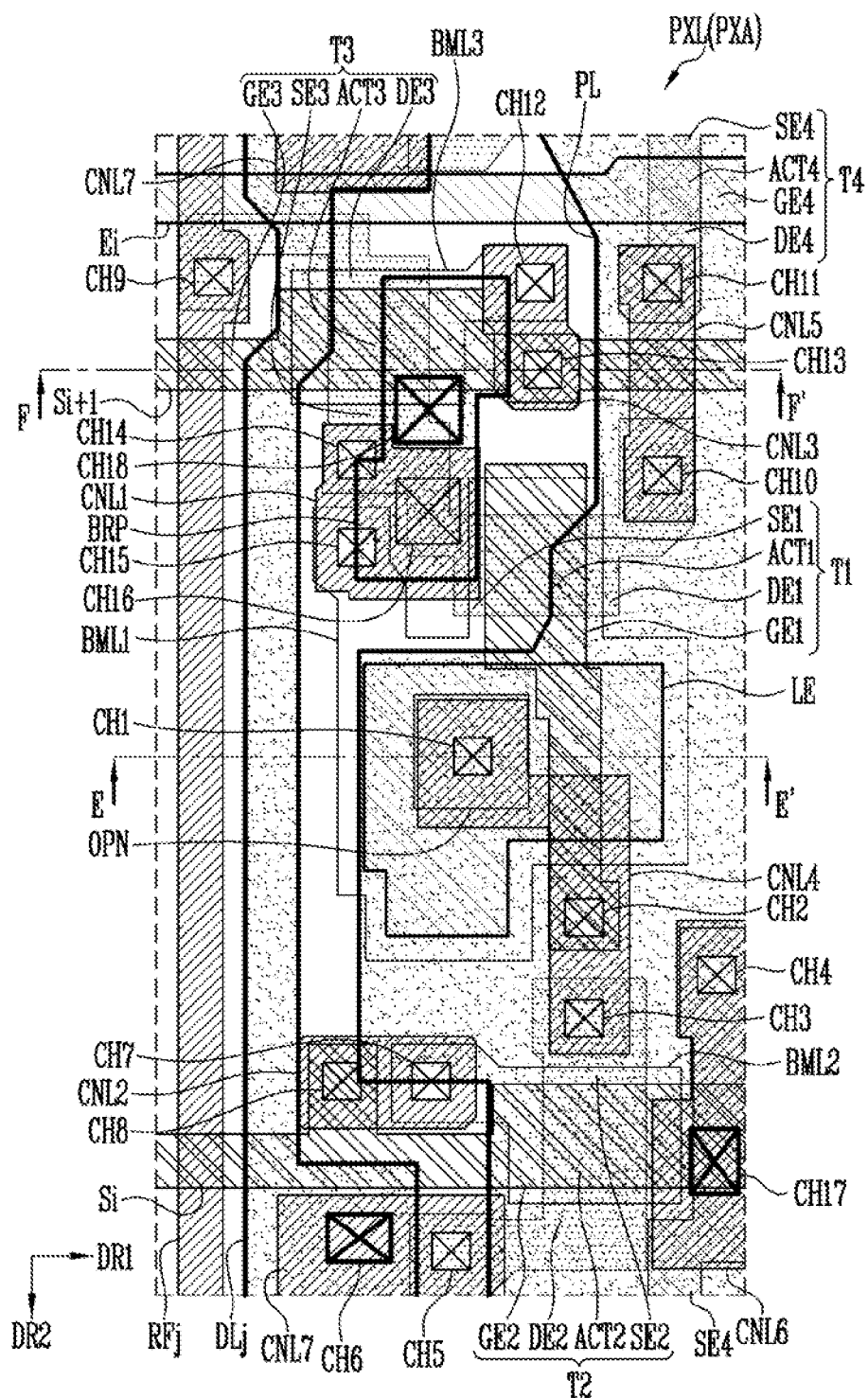
FIG. 11 is a plan view schematically illustrating one pixel in accordance with an embodiment of the present disclosure.
Figure 12:
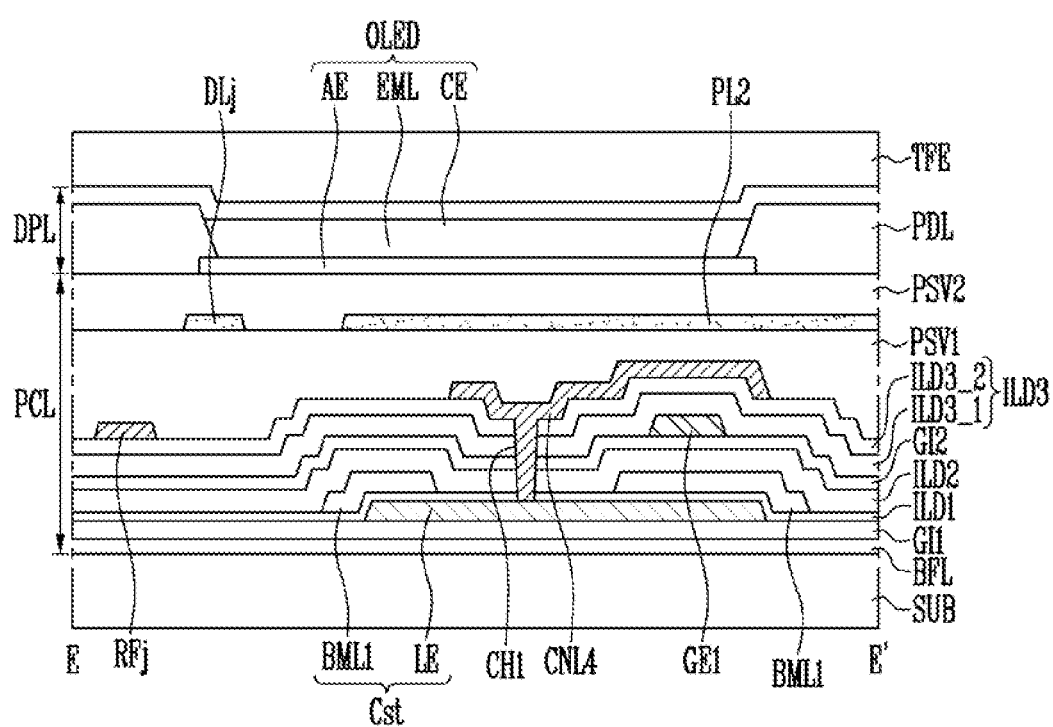
FIG. 12 is a cross-sectional view taken along line E-E' shown in FIG. 11.
Figure 13:
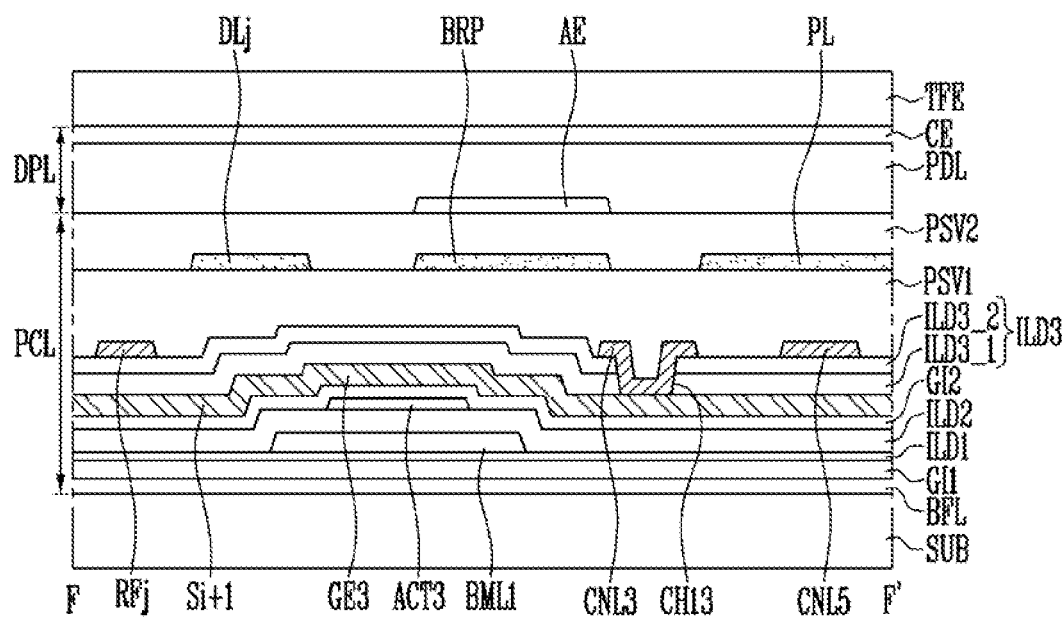
FIG. 13 is a cross-sectional view taken along line F-F' shown in FIG. 11.

FIG. 11 is a plan view schematically illustrating one pixel in accordance with an embodiment of the present disclosure. FIG. 12 is a cross-sectional view taken along line E-E' shown in FIG. 11. FIG. 13 is a cross-sectional view taken along line F-F' shown in FIG. 11.

In FIG. 11, illustration of a light emitting element OLED connected to first and third transistors T1 and T3 is omitted for convenience but it is to be understood that this elements is still present in the illustrated embodiment.

In FIGS. 11 to 13, portions different from those of the above-described embodiment will be mainly described to avoid redundancy. Portions not particularly described in the embodiment shown in FIGS. 11 to 13 follow those of the above-described embodiment. In addition, identical reference numerals may refer to identical components, and similar reference numerals may refer to similar components.

Referring to FIGS. 1 to 3 and 11 to 13, the display device, in accordance with the embodiment of the present disclosure, may include a substrate SUB, a line unit, and pixels PXL.

A plurality of insulating layers and a plurality of conductive layers may be disposed on the substrate SUB.

In an embodiment of the present disclosure, the insulating layers may include, for example, a buffer layer BFL, a first gate insulating layer GI1, first and second interlayer insulating layers ILD1 and ILD2, a second gate insulating layer GI2, a third interlayer insulating layer ILD3, a first passivation layer PSV1, and a second passivation layer PSV2, which are sequentially stacked on the substrate SUB. The buffer layer BFL, the first gate insulating layer GI1, the first and second interlayer insulating layers ILD1 and ILD2, the second gate insulating layer GI2, the third interlayer insulating layer ILD3, the first passivation layer PSV1, and the second passivation layer PSV2, which are described above, correspond to components substantially identical to the buffer layer BFL, the first gate insulating layer GI1, the first and second interlayer insulating layers ILD1 and ILD2, the second gate insulating layer GI2, the third interlayer insulating layer ILD3, the first passivation layer PSV1, and the second passivation layer PSV2, which are described with reference to FIGS. 4 and 8, and therefore, their descriptions will be simplified.

The conductive layers may be disposed and/or formed between the above-described insulating layers. In an embodiment of the present disclosure, the conductive layers may include, for example, a first conductive layer disposed on the first gate insulating layer GI1, a second conductive layer disposed on the first interlayer insulating layer ILD1, a third conductive layer disposed on the second gate insulating layer GI2, a fourth conductive layer disposed on the third interlayer insulating layer ILD3, and a fifth conductive layer disposed on the first passivation layer PSV1.

Each pixel PXL may be disposed in a pixel area PXA included in the display area DA of the substrate SUB. Each pixel PXL may include a pixel circuit layer PCL having a pixel circuit PXC and a display element layer DPL having a light emitting element OLED.

First and second scan lines Si and Si+1, an emission control line Ei, a reference voltage line RFj, a data line DLj, and a power line PL may be disposed in the pixel area PXA in which each pixel PXL is disposed. The first and second scan lines Si and Si+1, the emission control line Ei, the reference voltage line RFj, the data line DLj, and the power line PL correspond to components substantially identical to the first and second scan lines Si and Si+1, the emission control line Ei, the reference voltage line RFj, the data line DLj, and the power line PL, which are described with reference to FIGS. 4 and 8, and therefore, their descriptions will be simplified.

The first and second scan lines Si and Si+1 may correspond to the third conductive layer disposed on the second gate insulating layer GI2, and the emission control line Ei may correspond to the first conductive layer disposed on the first gate insulating layer GI1. The reference voltage line RFj may correspond to the fourth conductive layer disposed on the third interlayer insulating layer ILD3, and the data line DLj and the power line PL may correspond to the fifth conductive layer disposed on the first passivation layer PSV1.

The pixel circuit layer PCL may include the buffer layer BFL disposed on the substrate SUB, the pixel circuit PXC disposed on the buffer layer BFL, and the first and second passivation layers PSV1 and PSV2 disposed over the pixel circuit PXC. Also, the pixel circuit layer PCL may include first to third conductive patterns BML1 to BML3 connected to components included in the pixel circuit PXC.

The pixel circuit PXC may include first to fourth transistors T1 to T4 and a storage capacitor Cst. Among the first to fourth transistors T1 to T4, the first to third transistors T1 to T3 may be implemented with an oxide transistor, and the fourth transistor T4 may be implemented with a poly-silicon transistor. Also, among the first to fourth transistors T1 to T4, the first transistor T1 may be a driving transistor.

The first transistor T1 may include a first gate electrode GE1, a first active pattern ACT1, a first source region SE1, and a first drain region DE1.

The first gate electrode GE1 may correspond to the third conductive layer disposed on the second gate insulating layer GI2. The first gate electrode GE1 may be disposed in the same layer as the first and second scan lines Si and Si+1, and may include the same material as the first and second scan lines Si and Si+1. The first gate electrode GE1 may be connected to a fourth connection line CNL4 through a second contact hole CH2 penetrating the third interlayer insulating layer ILD3.

In an embodiment of the present disclosure, the fourth connection line CNL4 may correspond to the fourth conductive layer disposed on the third interlayer insulating layer ILD3. The fourth connection line CNL4 may be disposed in the same layer as the reference voltage line RFj, and may include the same material as the reference voltage line RFj. The fourth connection line CNL4 may be connected to the first gate electrode GE1 through the second contact hole CH2. Also, the fourth connection line CNL4 may be connected to a second source region SE2 of the second transistor T2 through a third contact hole CH3 sequentially penetrating the second gate insulating layer GI2 and the third interlayer insulating layer ILD3. Accordingly, the first gate electrode GE1 may be connected to the second source region SE2 through the second contact hole CH2, the fourth connection line CNL4, and the third contact hole CH3.

The first active pattern ACT1 is a region overlapping the first gate electrode GE1, and may be a channel region of the first transistor T1. The first active pattern ACT1 may be disposed on the second interlayer insulating layer ILD2.

The first source region SE1 may be connected to each of one end of the first active pattern ACT1 and a source region SE3 of the third transistor T3.

The first drain region DE1 may be connected to the other end of the first active pattern ACT1, and may be connected to a fourth drain region DE4 of the fourth transistor T4 through a fifth connection line CNL5.

The fifth connection line CNL5 may be connected to the first drain region DE1 through a tenth contact hole CH10 sequentially penetrating the second gate insulating layer GI2 and the third interlayer insulating layer ILD3. Also, the fifth connection line CNL5 may be connected to the fourth drain region DE4 through an eleventh contact hole CH11 sequentially penetrating the first gate insulating layer GI1, the first and second interlayer insulating layer ILD1 and ILD2, the second gate insulating layer GI2, and the third interlayer insulating layer ILD3.

In an embodiment of the present disclosure, the first conductive pattern BML1 may be disposed under the first transistor T1. Therefore, the first conductive pattern BML1 may overlap the first transistor T1. In an example, the first conductive pattern BML1 may overlap the first gate electrode GE1 of the first transistor T1.

The first conductive pattern BML1 may correspond to the second conductive layer disposed on the first interlayer insulating layer ILD1. The first conductive pattern BML1 may be connected to a first connection line CNL1 through a fifteenth contact hole CH15 sequentially penetrating the second interlayer insulating layer ILD2, the second gate insulating layer GI2, and the third interlayer insulating layer ILD3. The first conductive pattern BML1 may include an opening OPN corresponding to a region in which a first contact hole CH1 is formed.

The first connection line CNL1 may correspond to the fourth conductive layer disposed on the third interlayer insulating layer ILD3. The first connection line CNL1 may be connected to the first source region SE1 of the first transistor T1 and the third source region SE3 of the third transistor T3 through a fourteenth contact hole CH14 sequentially penetrating the second gate insulating layer GI2 and the third interlayer insulating layer ILD3.

Accordingly, the first conductive pattern BML1 may be connected to the first source region SE1 of the first transistor T1 and the third source region SE3 of the third transistor T3 through the fifteenth contact hole CH15, the first connection line CNL1, and the fourteenth contact hole CH14.

One region of the first connection line CNL1 may be exposed through a sixteenth contact hole CH16 penetrating the first passivation layer PSV1. The one region of the first connection line CNL1, which is exposed, may be connected to a bridge pattern BRP disposed on the first passivation layer PSV through the sixteenth contact hole CH16.

The bridge pattern BRP may correspond to the fifth conductive layer disposed on the first passivation layer PSV1. The bridge pattern BRP may be disposed in the same layer as the data line DLj and the power line PL, and include the same material as the data line DLj and the power line PL. One region of the bridge pattern BRP may be exposed through an eighteenth contact hole CH18 penetrating the second passivation layer PSV2. The one region of the bridge pattern BRP, which is exposed, may be connected to a first electrode AE of the light emitting element OLED through the eighteenth contact hole CH18. Consequently, the first electrode AE of the light emitting element OLED may be connected to the first source region SE1 of the first transistor T1 and the third source region SE3 of the third transistor T3 through the eighteenth contact hole CH18, the bridge pattern BRP, the sixteenth contact hole, and the first connection line CNL1.

Meanwhile, in an embodiment of the present disclosure, a lower electrode LE may be disposed between the substrate SUB and the first conductive pattern BML1. The lower electrode LE may correspond to the first conductive layer disposed on the first gate insulating layer Gil. The lower electrode LE may be disposed in the same layer as the emission control line Ei, and may include the same material as the emission control line Ei. The lower electrode LE may overlap the first conductive pattern BML1. The first conductive pattern BML1 may overlap the lower electrode LE with the first interlayer insulating layer ILD1 interposed therebetween.

In an embodiment of the present disclosure, the lower electrode LE may be connected to the fourth connection line CNL4 through the first contact hole CH1 sequentially penetrating the first and second interlayer insulating layers ILD1 and ILD2, the second gate insulating layer GI2, and the third interlayer insulating layer ILD3. Since the fourth connection line CNL4 is connected to the second source region SE2 of the second transistor T2, and the second source region SE2 is connected to the first gate electrode GE1, a gate voltage (or gate signal) applied to the first gate electrode GE1 may be finally transferred to the fourth connection line CNL4 and the lower electrode LE.

The fourth connection line CNL4 may be disposed on the first gate electrode GE1. When viewed on a plane, the lower electrode LE, the first conductive pattern BML1, the first gate electrode GE1, and the fourth connection line CNL4 may overlap each other.

The first conductive pattern BML1 may overlap the lower electrode LE with the first interlayer insulating layer ILD1 interposed therebetween, the first gate electrode GE1 may overlap the first conductive pattern BML1 with the first and second interlayer insulating layers ILD1 and ILD2 interposed therebetween, and the fourth connection line CNL4 may overlap the first gate electrode GE1 with the third interlayer insulating layer ILD3 interposed therebetween. Accordingly, a capacitance caused by capacitive coupling may be formed between the lower electrode LE and the first conductive pattern BML1, a capacitance caused by capacitive coupling may be formed between the first conductive pattern BML1 and the first gate electrode GE1, and a capacitance caused by capacitive coupling may be formed between the first gate electrode GE1 and the fourth connection line CNL4. Therefore, these capacitances may form a capacitance of the storage capacitor Cst of each pixel PXL.

In an embodiment of the present disclosure, the lower electrode LE may be a first electrode of the storage capacitor Cst, the first conductive pattern BML1 may be a second electrode of the storage capacitor Cst, the first gate electrode GE1 may be a third electrode of the storage capacitor Cst, and the fourth connection line CNL4 may be a fourth electrode of the storage capacitor Cst.

The second transistor T2 may include a second gate electrode GE2, a second active pattern ACT2, the second source region SE2, and a second drain region DE2. In an embodiment of the present disclosure, the second active pattern ACT2, the second source region SE2, and the second drain region DE2 may be disposed on the second interlayer insulating layer ILD2.

The second gate electrode GE2 may be integrally provided with the first scan line Si. The second gate electrode GE2 may correspond to the third conductive layer disposed on the second gate insulating layer GI2.

The second active pattern ACT2 is a region overlapping the second gate electrode GE2, and may be a channel region of the second transistor T2.

The second source region SE2 may be connected to one end of the second active pattern ACT2, and may be connected to the first gate electrode GE1 of the first transistor T1 through the fourth connection line CNL4.

The second drain region DE2 may be connected to the other end of the second active pattern ACT2, and may be connected to a seventh connection line CNL7 through a fifth contact hole CH5 sequentially penetrating the second gate insulating layer GI2 and the third interlayer insulating layer ILD3.

The seventh connection line CNL7 may correspond to the fourth conductive layer disposed on the third interlayer insulating layer ILD3. The seventh connection line CNL7 may be disposed in the same layer as the reference voltage line RFj, and may include the same material as the reference voltage line RFj. The seventh connection line CNL7 may be connected to the data line DLj through a sixth contact hole CH6 penetrating the first passivation layer PSV1. Therefore, the second drain region DE2 may be connected to the data line DLj through the fifth contact hole CH5, the seventh connection line CNL7, and the sixth contact hole CH6. Accordingly, a data voltage (or data signal) applied to the data line DLj may be transferred to the second drain region DE2.

In an embodiment of the present disclosure, the second conductive pattern BML2 may be disposed under the second transistor T2. Therefore, the second conductive pattern BML2 may overlap the second transistor T2.

The second conductive pattern BML2 may correspond to the second conductive layer disposed on the first interlayer insulating layer ILD1. The second conductive pattern BML2 may be connected to a second connection line CNL2 through a seventh contact hole CH7 sequentially penetrating the second interlayer insulating layer ILD2, the second gate insulating layer GI2, and the third interlayer insulating layer ILD3.

The second connection line CNL2 may be connected to the second conductive pattern BML2 through the seventh contact hole CH7. Also, the second connection line CNL2 may be connected to the second gate electrode GE2 through an eighth contact hole CH8 penetrating the third interlayer insulating layer ILD3. Accordingly, the second gate electrode GE may be connected to the second conductive pattern BML2 through the eighth contact hole CH8, the second connection line CNL2, and the seventh contact hole CH7.

The third transistor T3 may include a third gate electrode GE3, a third active pattern ACT3, the third source region SE3, and a third drain region DE3. In an embodiment of the present disclosure, the third active pattern ACT3, the third source region SE3, and the third drain region DE3 may be disposed on the second interlayer insulating layer ILD2.

The third gate electrode GE3 may be integrally provided with the second scan line Si+1. The third gate electrode GE3 may correspond to the third conductive layer disposed on the second gate insulating layer GI2.

The third active pattern ACT3 is a region overlapping the third gate electrode GE3, and may be a channel region of the third transistor T3.

The third source region SE3 may be connected to one end of the third active pattern ACT3, and may be connected to the first source region SE1 of the first transistor T1.

The third drain region DE3 may be connected to the other end of the third active pattern ACT3, and may be connected to the reference voltage line RFj through a ninth contact hole CH9 sequentially penetrating the second gate insulating layer GI2 and the third interlayer insulating layer ILD3.

In an embodiment of the present disclosure, the third conductive pattern BML3 may be disposed under the third transistor T3. Therefore, the third conductive pattern BML3 may overlap the third transistor T3.

The third conductive pattern BML3 may correspond to the second conductive layer disposed on the first interlayer insulating layer ILD1. The third conductive pattern BML3 may be connected to a third connection line CNL3 through a twelfth contact hole CH12 sequentially penetrating the second interlayer insulating layer ILD2, the second gate insulating layer GI2, and the third interlayer insulating layer ILD3.

The third connection line CNL3 may be connected to the third gate electrode GE3 through a thirteenth contact hole CH13 penetrating the third interlayer insulating layer ILD3. Accordingly, the third gate electrode GE3 may be connected to the third conductive pattern BML3 through the thirteenth contact hole CH13, the third connection line CNL3, and the twelfth contact hole CH12.

The fourth transistor T4 may include a fourth gate electrode GE4, a fourth active pattern ACT4, a fourth source region SE4, and the fourth drain region DE4. In an embodiment of the present disclosure, the fourth active pattern ACT4, the fourth source region SE4, and the fourth drain region DE4 may be disposed on the buffer layer BFL.

The fourth gate electrode GE4 may be integrally provided with the emission control line Ei. The fourth gate electrode GE4 may correspond to the first conductive layer disposed on the first gate insulating layer GI1.

The fourth active pattern ACT4 is a region overlapping the fourth gate electrode GE4, and may be a channel region of the fourth transistor T4.

The fourth source region SE4 may be connected to one end of the fourth active pattern ACT4, and may be connected to a sixth connection line CNL6 through a fourth contact hole CH4 sequentially penetrating the first and second interlayer insulating layers ILD1 and ILD2, the second gate insulating layer GI2, and the third interlayer insulating layer ILD3.

The sixth connection line CNL6 may be connected to the fourth source region SE4 through the fourth contact hole CH4, and may be connected to the power line PL through a seventeenth contact hole CH17 penetrating the first passivation layer PSV1. Accordingly, the fourth source region SE4 may be connected to the power line PL through the fourth contact hole CH4, the sixth connection line CNL6, and the seventeenth contact hole CH17. Therefore, the voltage of the first driving power source ELVDD applied to the power line PL may be transferred to the fourth source region SE4.

The fourth drain region DE4 may be connected to the other end of the fourth active pattern ACT4, and may be connected to the first drain region DE1 of the first transistor T1 through the eleventh contact hole CH11, the fifth connection line CNL5, and the tenth contact hole CH10.

In the above-described embodiment, the fourth active pattern ACT4, the fourth source region SE4, and the fourth drain region DE4 may be disposed on the buffer layer BFL of each pixel PXL. In an embodiment of the present disclosure, each of the fourth active pattern ACT4, the fourth source region SE4, and the fourth drain region DE4 may be a semiconductor pattern made of poly-silicon, and have a thickness of about 500 Å. However, the present disclosure is not necessarily limited thereto. The first gate insulating layer GI1 may be disposed over the fourth active pattern ACT4, the fourth source region SE4, and the fourth drain region DE4.

In the above-described embodiment, the emission control line Ei and the lower electrode LE may be disposed on the first gate insulating layer GI1 of each pixel PXL. The emission control line Ei and the lower electrode LE may correspond to the first conductive layer. The emission control line Ei and the lower electrode LE may be made of an electrically conductive material, e.g., a metal. The emission control line Ei and the lower electrode LE may be formed in a single layer including one selected from the group consisting of molybdenum (Mo), tungsten (W), aluminum neodymium (AlNd), titanium (Ti), aluminum (Al), silver (Ag), and any alloy thereof or a mixture thereof, or be formed in a double- or multi-layered structure including molybdenum (Mo), aluminum (Al) or silver (Ag), which is a low-resistance material so as to decrease wiring resistance. In an embodiment of the present disclosure, the emission control line Ei and the lower electrode LE may be provided as a single layer including molybdenum (Mo). However, the material of the emission control line Ei and the lower electrode LE is not necessarily limited to the above-described embodiment. The first interlayer insulating layer ILD1 may be disposed over the emission control line Ei and the lower electrode LE.

The first to third conductive patterns BML1 to BML3 spaced apart from each other may be disposed on the first interlayer insulating layer ILD1 of each pixel PXL. The first to third conductive patterns BML1 to BML3 may correspond to the second conductive layer. The first conductive pattern BML1 may include the opening OPN exposing a portion of the first interlayer insulating layer ILD1 disposed thereunder. The first to third conductive patterns BML1 to BML3 may include the same material as the emission control line Ei and the lower electrode LE, or may include at least one material selected from the materials exemplified as the material constituting the emission control line Ei and the lower electrode LE. In an embodiment of the present disclosure, the first to third conductive patterns BML1 to BML3 may be provided as a single layer made of molybdenum (Mo). However, the material of the first to third conductive patterns BML1 to BML3 is not necessarily limited to the above-described embodiment. The second interlayer insulating layer ILD2 may be disposed over the first to third conductive patterns BML1 to BML3.

The first to third active patterns ACT1, ACT2, and ACT3, the first to third source regions SE1, SE2, and SE3, and the first to third drain regions DE1, DE2, and DE3 may be disposed on the second interlayer insulating layer ILD2 of each pixel PXL. The first to third active patterns ACT1, ACT2, and ACT3, the first to third source regions SE1, SE2, and SE3, and the first to third drain regions DE1, DE2, and DE3 may be made of an oxide semiconductor. In an example, the first to third active patterns ACT1, ACT2, and ACT3, the first to third source regions SE1, SE2, and SE3, and the first to third drain regions DE1, DE2, and DE3 may be made of indium-gallium-zinc oxide (InGaZnO4). However, the material of the first to third active patterns ACT1, ACT2, and ACT3, the first to third source regions SE1, SE2, and SE3, and the first to third drain regions DE1, DE2, and DE3 is not necessarily limited to the above-described embodiment. The second gate insulating layer GI2 may be disposed over the first to third active patterns ACT1, ACT2, and ACT3, the first to third source regions SE1, SE2, and SE3, and the first to third drain regions DE1, DE2, and DE3.

The first and second scan lines Si and Si+1 and the first to third gate electrodes GE1, GE2, and GE3 may be disposed on the second gate insulating layer GI2 of each pixel PXL. The first and second scan lines Si and Si+1 and the first to third gate electrodes GE1, GE2, and GE3 may correspond to the third conductive layer. The second gate electrode GE2 may be integrally provided with the first scan line Si, and the third gate electrode GE3 may be integrally provided with the second scan line Si+1. The first and second scan lines Si and Si+1 and the first to third gate electrodes GE1, GE2, and GE3 may include the same material as the emission control line Ei and the lower electrode LE, or include at least one material selected from the materials exemplified as the material constituting the emission control line Ei and the lower electrode LE. In an embodiment of the present disclosure, the first and second scan lines Si and Si+1 and the first to third gate electrodes GE1, GE2, and GE3 may be provided in a double layer including a first layer made of titanium (Ti) and a second layer made of molybdenum (Mo). However, the material of the first and second scan lines Si and Si+1 and the first to third gate electrodes GE1, GE2, and GE3 is not necessarily limited to the above-described embodiment. The third interlayer insulating layer ILD3 may be disposed over the first and second scan lines Si and Si+1 and the first to third gate electrodes GE1, GE2, and GE3.

The reference voltage line RFj and the first to seventh connection lines CNL1 to CNL7 may be disposed on the third interlayer insulating layer ILD3 of each pixel PXL. The reference voltage line RFj and the first to seventh connection lines CNL1 to CNL7 may correspond to the fourth conductive layer. The reference voltage line RFj and the first to seventh connection lines CNL1 to CNL7 may include the same material as the emission control line Ei and the lower electrode LE, or include at least one material selected from the materials exemplified as the material constituting the emission control line Ei and the lower electrode LE. In an embodiment of the present disclosure, the reference voltage line RFj and the first to seventh connection lines CNL1 to CNL7 may be provided as a multi-layer structure in which a first layer made of titanium (Ti), a second layer made of aluminum (Al), and a third layer made of titanium (Ti) are sequentially stacked. However, the material of the reference voltage line RFj and the first to seventh connection lines CNL1 to CNL7 is not necessarily limited to the above-described embodiment. The first passivation layer PSV1 may be disposed over the reference voltage line RFj and the first to seventh connection lines CNL1 to CNL7.

The data line DLj, the power line PL, and the bridge pattern BRP may be disposed on the first passivation layer PSV1 of each pixel PXL. The data line DLj, the power line PL, and the bridge pattern BRP may correspond to the fifth conductive layer. The data line DLj, the power line PL, and the bridge pattern BRP may include the same material as the emission control line Ei and the lower electrode LE, or include at least one material selected from the materials exemplified as the material constituting the emission control line Ei and the lower electrode LE. In an embodiment of the present disclosure, the data line DLj, the power line PL, and the bridge pattern BRP may be provided as a multi-layer structure in which a first layer made of titanium (Ti), a second layer made of aluminum (Al), and a third layer made of titanium (Ti) are sequentially stacked. However, the material of the data line DLj, the power line PL, and the bridge pattern BRP is not necessarily limited to the above-described embodiment. The second passivation layer PSV2 may be disposed over the data line DLj, the power line PL, and the bridge pattern BRP.

In an embodiment of the present disclosure, the power line PL may partially overlap the first transistor T1 when viewed on a plane, to cover a portion of the first transistor T1. When a portion of the first transistor T1 is covered by expanding the power line PL, the power line PL can block vertical capacitive coupling formed between the data line DL and the first gate electrode GE1 of the first transistor T1. Accordingly, crosstalk is prevented between the data line DLj and the first transistor T1, so that an image quality failure caused by the crosstalk can be reduced.

As described above, the capacitance of the storage capacitor Cst in each pixel PXL can be further secured by the lower electrode LE, the first conductive pattern BML1, the first gate electrode GE1, and the fourth connection line CNL4, which overlap each other with at least one insulating layer interposed therebetween. Accordingly, each pixel PXL can be more stably driven.

Also, as described above, each of the first conductive pattern BML1, the first transistor T1, and the fourth connection line CNL4 is used as one electrode of the storage capacitor Cst, so that a space in which the storage capacitor Cst can be formed within a narrow space of the pixel area PXA can be sufficiently secured. Accordingly, a display device capable of easily implementing high resolution can be provided.

Figure 14:
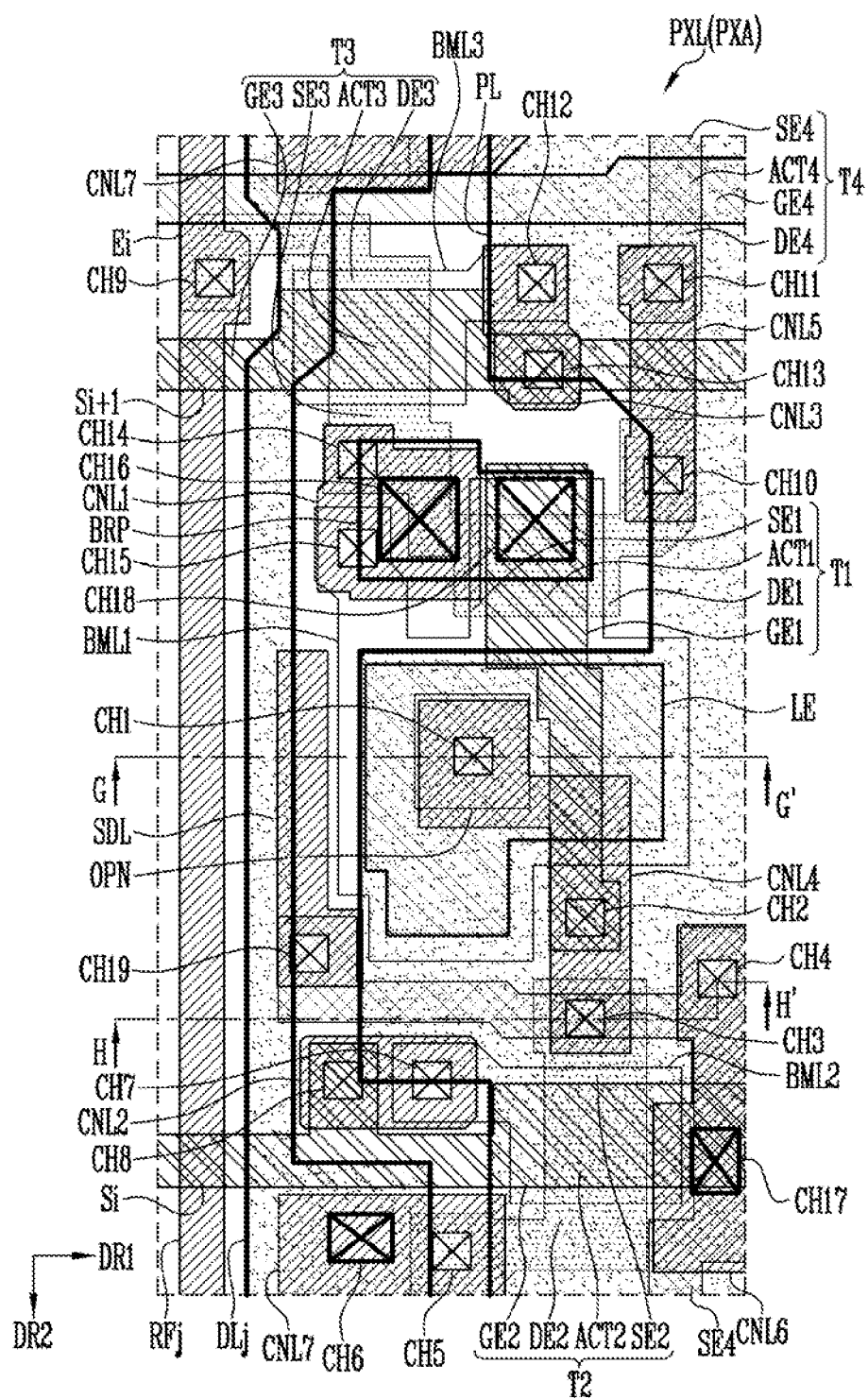
FIG. 14 is a plan view schematically illustrating one pixel in accordance with an embodiment of the present disclosure.
Figure 15:
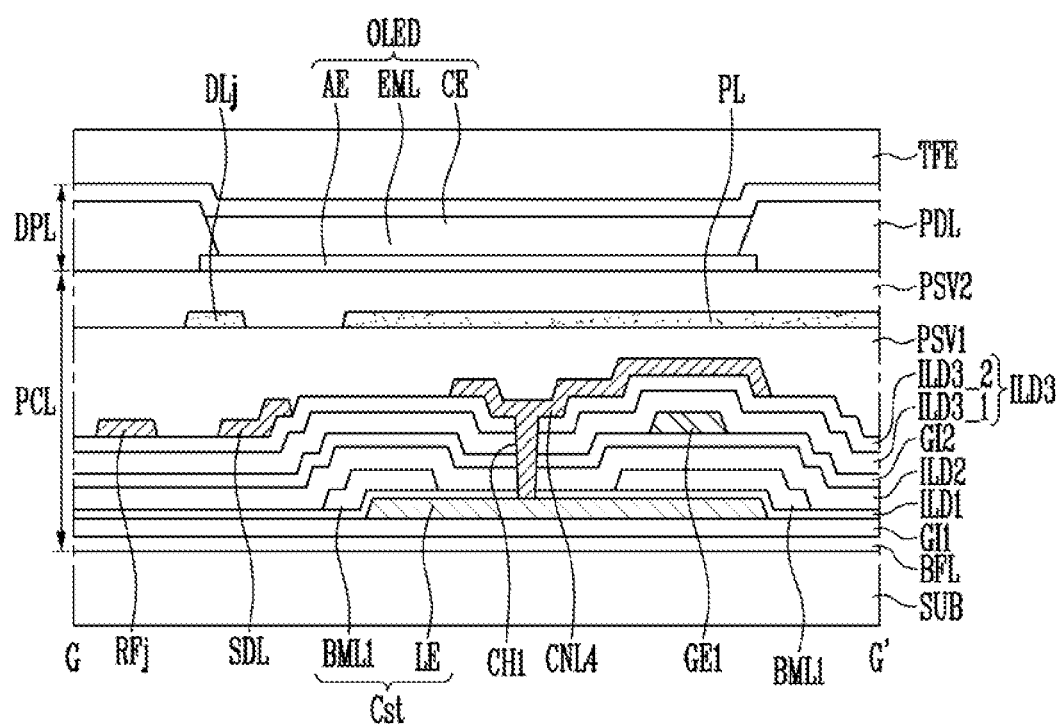
FIG. 15 is a cross-sectional view taken along line G-G' shown in FIG. 14.
Figure 16:
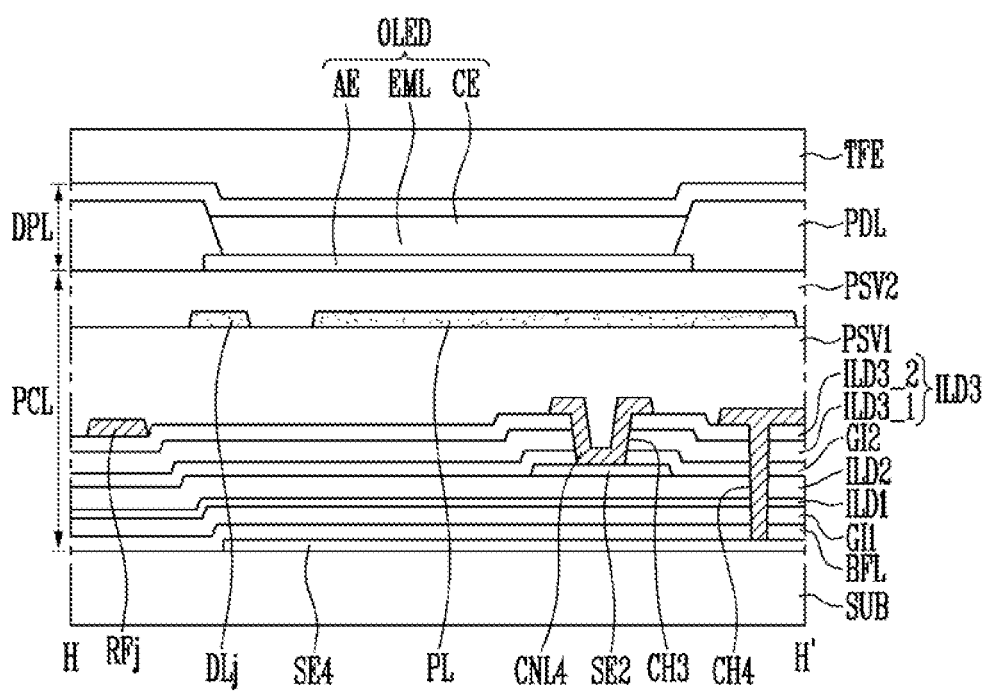
FIG. 16 is a cross-sectional view taken along line H-H' shown in FIG. 14.

FIG. 14 is a plan view schematically illustrating one pixel in accordance with an embodiment of the present disclosure. FIG. 15 is a cross-sectional view taken along line G-G' shown in FIG. 14. FIG. 16 is a cross-sectional view taken along line H-H' shown in FIG. 14.

In FIG. 14, illustration of a light emitting element OLED connected to first and third transistors T1 and T3 is omitted for convenience but it is to be understood that this elements is still present in the illustrated embodiment.

The pixel shown in FIGS. 14 to 16 may have a configuration substantially identical to the pixel shown in FIG. 11, except that a shielding member SDL is disposed between the first transistor T1 and a data line DLj.

In FIGS. 14 to 16, portions different from those of the above-described embodiment will be mainly described to avoid redundancy. Portions not particularly described in the embodiment shown in FIGS. 14 to 16 follow those of the above-described embodiment. In addition, identical reference numerals may refer to identical components, and similar reference numerals may refer to similar components.

Referring to FIGS. 1 to 3 and 14 to 16, the display device in accordance with the embodiment of the present disclosure may include a substrate SUB, a line unit, and pixels PXL.

Each pixel PXL may be disposed in a pixel area PXA included in the display area DA of the substrate SUB.

First and second scan lines Si and Si+1, an emission control line Ei, a reference voltage line RFj, the data line DLj, and a power line PL may be disposed in the pixel area PXA in which each pixel PXL is disposed.

The first and second scan lines Si and Si+1 may correspond to a third conductive layer disposed on a second gate insulating layer GI2, and the emission control line Ei may correspond to a first conductive layer disposed on a first gate insulating layer GI1. The reference voltage line RFj may correspond to a fourth conductive layer disposed on a third interlayer insulating layer ILD3, and the data line DLj and the power line PL may correspond to a fifth conductive layer disposed on a first passivation layer PSV1.

Each pixel PXL may include a pixel circuit layer PCL having a pixel circuit PXC and a display element layer DPL having the light emitting element OLED.

The pixel circuit layer PCL may include a buffer layer BFL, a lower electrode LE, first to fourth transistors T1 to T4, and first to third conductive patterns BML1 to BML3. Also, the pixel circuit layer PCL may include insulating layers disposed between components disposed in each of the first to fourth transistors T1 to T4.

Among the first to fourth transistors T1 to T4, the first to third transistors T1 to T3 may be implemented with an oxide transistor, and the fourth transistor T4 may be implement with a poly-silicon transistor.

In an embodiment of the present disclosure, as shown in FIG. 14, the shielding member SDL may be disposed between the data line DLj and the first transistor T1. The shielding member SDL may overlap at least a portion of the data line DLj when viewed on a plane, but the present disclosure is not necessarily limited thereto.

The shielding member SDL may correspond to the fourth conductive layer disposed on the third interlayer insulating layer ILD3. The shielding member SDL may be disposed in the same layer as the reference voltage line RFj and the first to seventh connection lines CNL1 to CNL7, which are described with reference to FIGS. 11 to 13, and include the same material as the reference voltage line RFj and the first to seventh connection lines CNL1 to CNL7.

The shielding member SDL may be connected to a fourth source region SE4 of the fourth transistor T4 through a nineteenth contact hole CH19 sequentially penetrating first and second interlayer insulating layers ILD1 and ILD2, the second gate insulating layer GI2, and the third interlayer insulating layer ILD3.

The fourth source region SE4 may be connected to the power line PL through a fourth contact hole CH4, a sixth connection line CNL6, and a seventeenth contact hole CH17. The shielding member SDL may be connected to the power line PL through the nineteenth contact hole CH19, the fourth source region SE4, the fourth contact hole CH4, the sixth connection line CNL6, and the seventeenth contact hole CH17. Therefore, the voltage of the first driving power source ELVDD, which is applied to the power line PL, may be transferred to the shielding member SDL. A first gate electrode GE1 of the first transistor T1, which is used as one electrode of a storage capacitor Cst, may be widely formed so as to secure a capacitance of the storage capacitor Cst in each pixel PXL. When the area of the first gate electrode GE1 becomes wide, the distance between the first gate electrode GE1 and the data line DLj may become close. Vertical capacitive coupling (e.g., a parasitic capacitor) may be formed between the first gate electrode GE1 and the data line DLj, and a crosstalk phenomenon may occur, in which a gate voltage (or gate signal) applied to the first gate electrode GE1 is changed according to a change in data voltage (or data signal) applied to the data line DLj.

In an embodiment of the present disclosure, the shielding member SDL is disposed between the data line DLj and a partial component, e.g., the first gate electrode GE1 of the first transistor T1, so that the vertical capacitive coupling between the data line DLj and the first gate electrode GE1 can be minimized. Accordingly, an interference between the data voltage (or data signal) transferred through the data line DLj and the gate voltage (or gate signal) applied to the first gate electrode GE1 of the first transistor T1 can be prevented.

Figure 17:
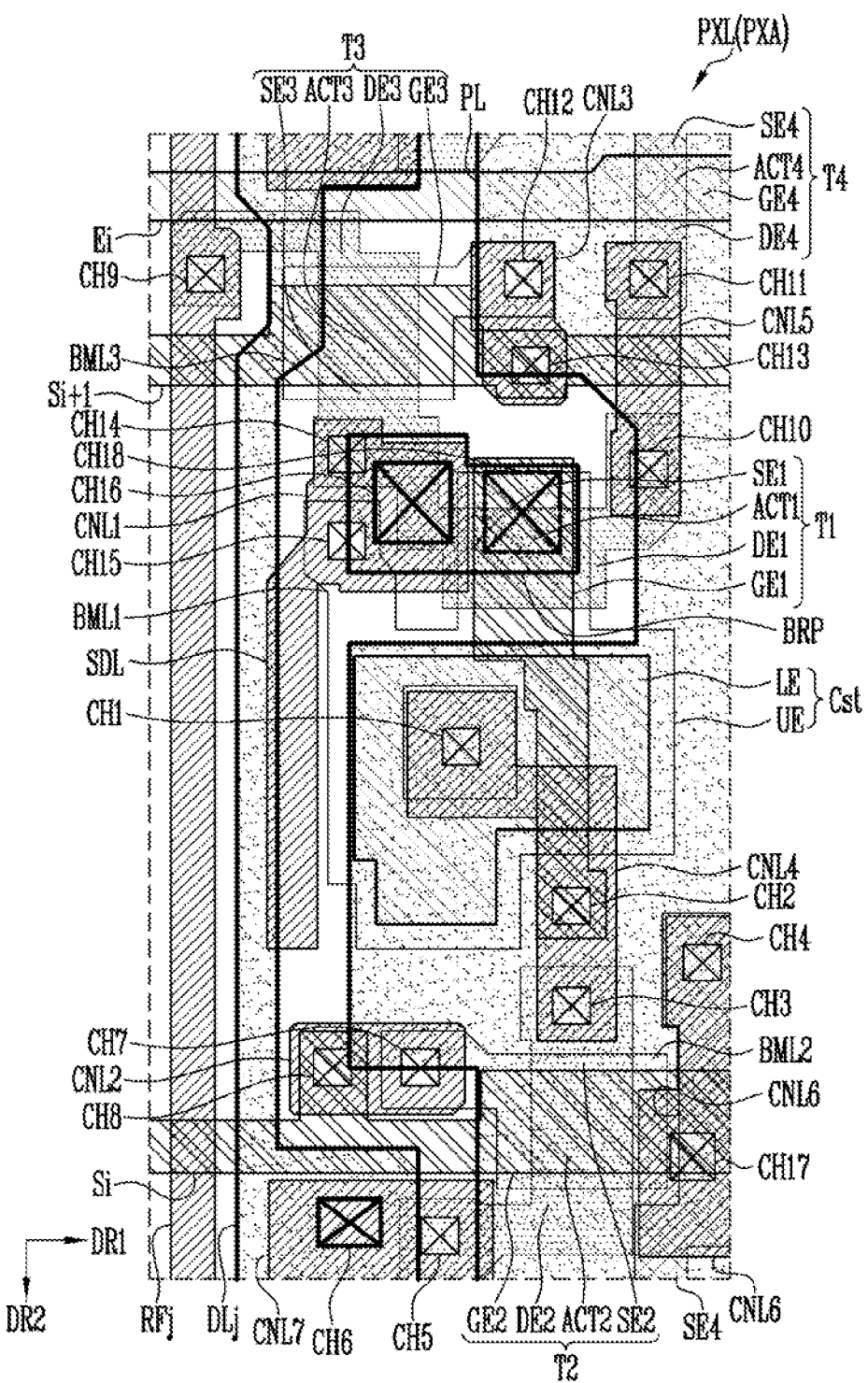
FIG. 17 is a plan view schematically illustrating one pixel in accordance with an embodiment of the present disclosure.

FIG. 17 is a plan view schematically illustrating one pixel in accordance with an embodiment of the present disclosure.

In FIG. 17, illustration of a light emitting element OLED connected to first and third transistors T1 and T3 is omitted for convenience but it is to be understood that this elements is still present in the illustrated embodiment.

The pixel shown in FIG. 17 may have a configuration substantially identical to the pixel shown in FIG. 14, except that the position of a shielding member is changed. In FIG. 17, portions different from those of the above-described embodiment will be mainly described to avoid redundancy. Portions not particularly described in the embodiment shown in FIG. 17 follow those of the above-described embodiment. In addition, identical reference numerals may refer to identical components, and similar reference numerals may refer to similar components.

Referring to FIGS. 1 to 3 and 17, each pixel PXL may be disposed in a pixel area PXA included in the display area DA of the substrate SUB.

Scan lines Si and Si+1, an emission control line Ei, a reference voltage line RFj, a data line DLj, and a power line PL, which are connected to a pixel circuit PXC, may be disposed in the pixel area PXA.

In an embodiment of the present disclosure, the shielding member SDL may be disposed between the data line DLj and a partial component of the pixel circuit PXC, e.g., the first transistor T1. The shielding member SDL may be disposed between the data line DLj and a first gate electrode GE1 of the first transistor T1.

In an embodiment of the present disclosure, the shielding member SDL may be integrally provided with a first connection line CNL1 and may be connected to the first connection line CNL1. When the shielding member SDL is integrally provided with the first connection line CNL1, the shielding member SDL may be considered as one region of the first connection line CNL1.

The first connection line CNL1 may be connected to a first source region SE1 of the first transistor T1 and a third source region SE3 of the third transistor T3 through a fourteenth contact hole CH14 sequentially penetrating a second interlayer insulating layer ILD2, a second gate insulating layer GI2, and a third interlayer insulating layer ILD3. Accordingly, a voltage applied to the first source region SE1 of the first transistor T1 and the third source region SE3 of the third transistor T3 may be transferred to the first connection line CNL1. As described above, since the shielding member SDL is integrally provided with the first connection line CNL1, the voltage applied to the first source region SE1 of the first transistor T1 and the third source region SE3 of the third transistor T3 can be transferred to the shielding member SDL.

When the shielding member SDL is disposed between the data line DLj and the first gate electrode GE1 of the first transistor T1, vertical capacitive coupling between the data line DLj and the first gate electrode GE1 can be minimized.

Figure 18:
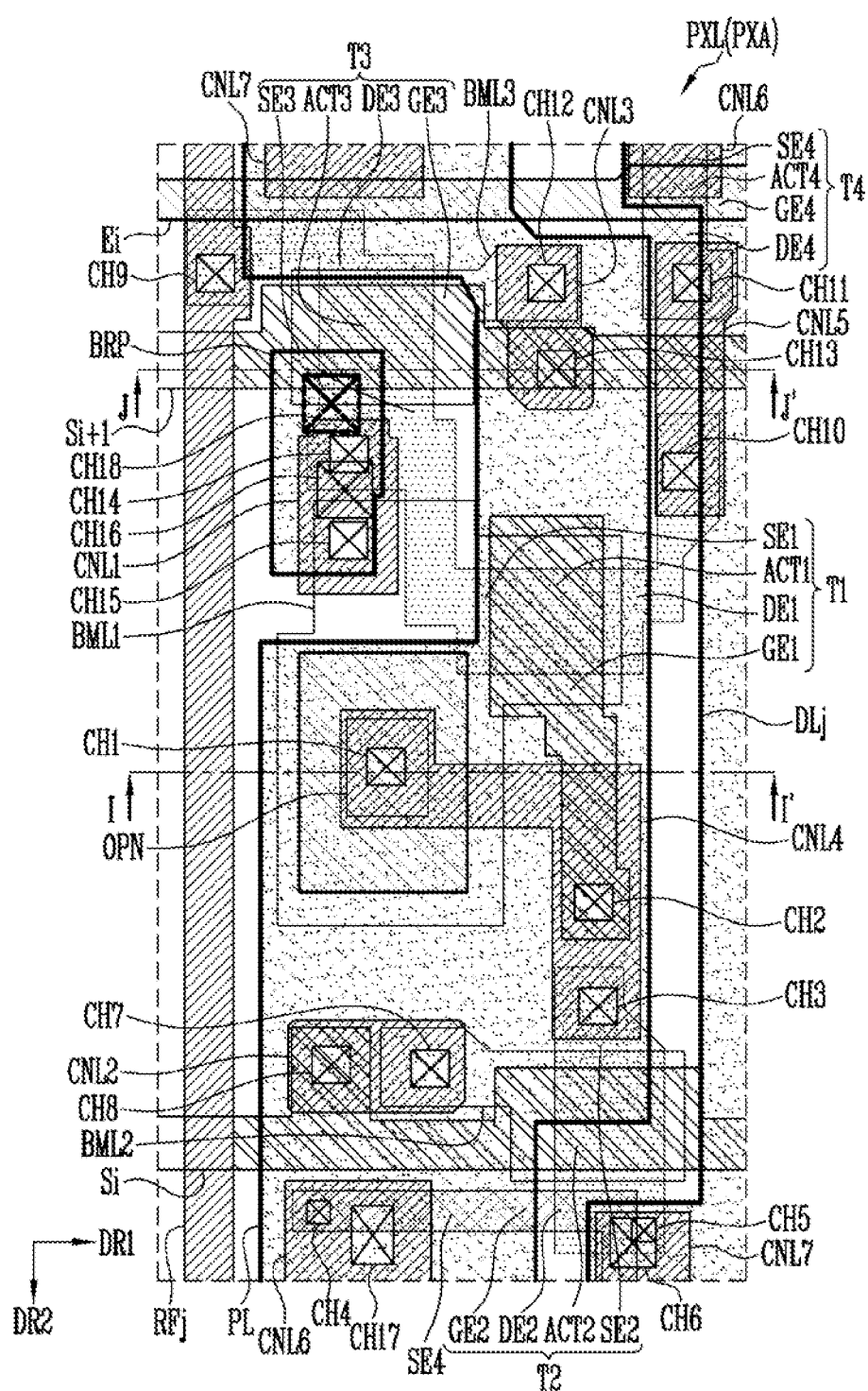
FIG. 18 is a plan view schematically illustrating one pixel in accordance with an embodiment of the present disclosure.
Figure 19:
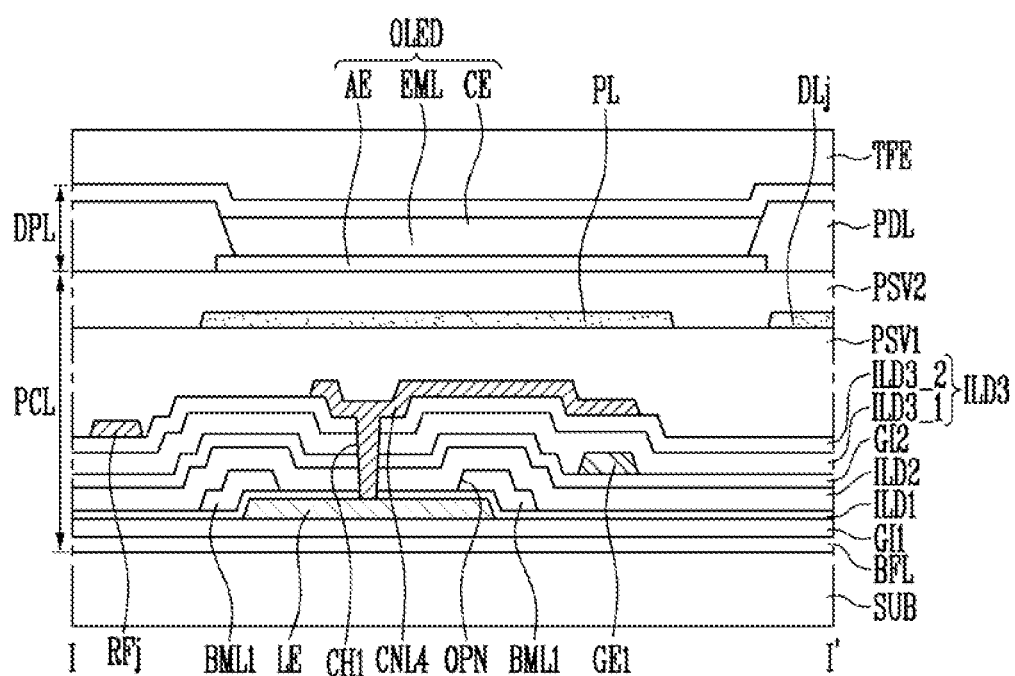
FIG. 19 is a cross-sectional view taken along line I-I' shown in FIG. 18.
Figure 20:
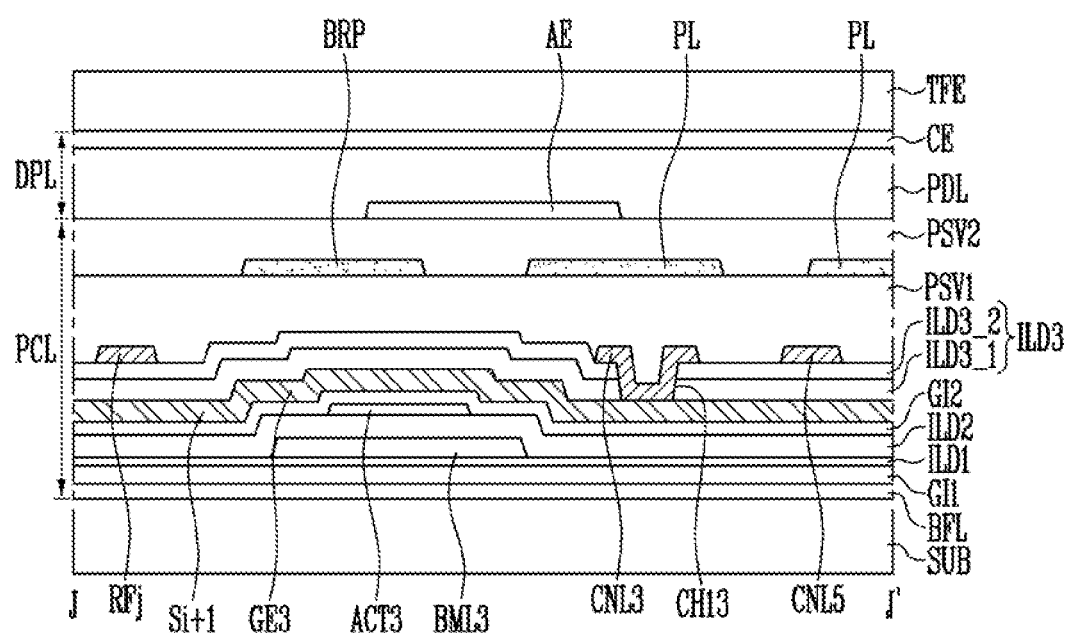
FIG. 20 is a cross-sectional view taken along line J-J' shown in FIG. 18

FIG. 18 is a plan view schematically illustrating one pixel in accordance with an embodiment of the present disclosure. FIG. 19 is a cross-sectional view taken along line I-I' shown in FIG. 18. FIG. 20 is a cross-sectional view taken along line J-J' shown in FIG. 18.

In FIG. 18, illustration of a light emitting element OLED connected to first and third transistors T1 and T3 is omitted for convenience but it is to be understood that this elements is still present in the illustrated embodiment.

The pixel shown in FIGS. 18 to 20 may have a configuration substantially identical to the pixel shown in FIG. 11, except that the positions of a data line DLj and a power line PL are changed. In FIGS. 18 to 20, portions different from those of the above-described embodiment will be mainly described to avoid redundancy. Portions not particularly described in the embodiment shown in FIGS. 18 to 20 follow those of the above-described embodiment. In addition, identical reference numerals may refer to identical components, and similar reference numerals may refer to similar components.

Referring to FIGS. 1 to 3 and 18 to 20, each pixel PXL may be disposed in a pixel area PXA included in the display area DA of the substrate SUB.

Scan lines Si and Si+1, an emission control line Ei, a reference voltage line RFj, the data line DLj, and the power line PL may be disposed in the pixel area PXA. Also, first to fourth transistors T1, first to third conductive patterns BML1 to BML3, a lower electrode LE, and first to seventh connection lines CNL1 to CNL7.

When viewed on a plane, the reference voltage line RFj, the power line PL, and the data line DLj may extend primarily along the second direction DR2, and may be sequentially arranged along the first direction DR1. In an embodiment of the present disclosure, the reference voltage line RFj may be disposed in a layer different from that of the data line DLj and the power line PL. In an example, the reference voltage line RFj may correspond to a fourth conductive layer disposed on a third interlayer insulating layer ILD3, and the data line DLj and the power line PL may correspond to a fifth conductive layer disposed on a first passivation layer PSV1.

When viewed on a plane, the reference voltage line RFj, the power line PL, and the data line DLj may be spaced apart from each other. The power line PL may be located between the reference voltage line RFj and the data line DLj. In an embodiment of the present disclosure, the power line PL may overlap a partial component, e.g., a first gate electrode GE1 of the first transistor T1 to cover the first gate electrode GE1.

In the pixel area PXA in which each pixel PXL is disposed, when the reference voltage line RFj, the power line PL, and the data line DLj are sequentially arranged along the first direction DR1, a distance between the data line DLj and a partial component, e.g., the first transistor T1 of a pixel circuit PXC may become more distant.

When the distance between the data line DLj and the first transistor T1 becomes more distant, and the first transistor T1 is covered by the power line PL, a gate voltage (or gate signal) applied to the first transistor T1 may be less influenced by a change in data voltage (or data signal) applied to the data line DLj. Accordingly, an image quality failure caused by crosstalk can be minimized by blocking vertical capacitive coupling (e.g., a parasitic capacitor) formed between the data line DLj and the first transistor T1.

In accordance with the present disclosure, there can be provided a display device in which an overlapping area of a first electrode and a second electrode with an insulating layer interposed therebetween is secured, and a capacitance of a storage capacitor is secured, so that a high resolution display may be more effectively implemented.

Further, in accordance with the present disclosure, there can be provided a display device in which a shielding member is disposed between a data line for transferring a data signal and a driving transistor, so that a parasitic capacitance between the data line and the driving transistor is minimized, thereby minimizing a change in signal of the driving transistor according to a change in data signal and vertical crosstalk caused by the change in signal of the driving transistor.

Embodiments have been disclosed herein, and although specific terms are employed, they are used and are to be interpreted in a generic and descriptive sense only and need not necessarily be limiting on embodiments of the present disclosure. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure.

What is claimed is:

1. A display device, comprising:
a substrate; and
a plurality of pixels disposed on the substrate,
wherein each of the plurality of pixels comprises:
a first transistor comprising a first source electrode, a first drain electrode, and a first active pattern between the first source electrode and the first drain electrode, the first source electrode, the first drain electrode, and the first active pattern being an oxide semiconductor;
a second transistor comprising a second source electrode, a second drain electrode, and a second active pattern between the second source electrode and the second drain electrode, the second source electrode, the second drain electrode, and the second active pattern being the oxide semiconductor;
a third transistor comprising a third source electrode, a third drain electrode, and a third active pattern between the third source electrode and the third drain electrode, the third source electrode, the third drain electrode, and the third active pattern being the oxide semiconductor;
a fourth transistor comprising a fourth source electrode, a fourth drain electrode, and a fourth active pattern between the fourth source electrode and the fourth drain electrode, the fourth source electrode, the fourth drain electrode, and the fourth active pattern being a poly-silicon semiconductor; and
a connection line disposed on the the first drain electrode of the first transistor and the fourth drain electrode of the fourth transistor, and
wherein the connection line connects the first drain electrode of the first transistor and the fourth drain electrode of the fourth transistor.

2. The display device of claim 1, wherein the first transistor further comprises:
a first gate electrode overlapping the first active pattern of the first transistor and connected to the second source electrode of the second transistor; and
a second gate electrode directly connected to the first source electrode of the first transistor.

3. The display device of claim 2, wherein each of the plurality of pixels further comprises a storage capacitor connected between the first source electrode of the first transistor and the first gate electrode of the first transistor.

4. The display device of claim 3, wherein the fourth transistor further comprises a gate electrode overlapping the fourth active pattern of the fourth transistor and connected to an emission control line, and
wherein the connection line is located between the storage capacitor and the emission control line in a plan view.

5. The display device of claim 4, wherein the first source electrode of the first transistor is connected to the third source electrode of the third transistor.

6. The display device of claim 5, wherein the second source electrode of the second transistor is connected to the first gate electrode of the first transistor and the second drain electrode of the second transistor is connected to a data line carrying a data signal.

7. The display device of claim 6, wherein the second transistor further comprises:
a first gate electrode overlapping the second active pattern of the second transistor and connected to a first scan line carrying an ith scan signal, wherein i is a positive integer; and
a second gate electrode directly connected to the first scan line.

8. The display device of claim 7, wherein the third source electrode of the third transistor is connected to the first source electrode of the first transistor and the third drain electrode of the third transistor is connected to a reference voltage line carrying a reference voltage.

9. The display device of claim 8, wherein the third transistor further comprises:
   a first gate electrode overlapping the third active pattern of the third transistor and connected to a second scan line carrying an (i+1)th scan signal; and
   a second gate electrode directly connected to the second scan line.

10. The display device of claim 9, wherein the fourth source electrode of the fourth transistor is connected to a first power line carrying a first driving voltage.

11. The display device of claim 10, wherein each of the plurality of pixels further comprises a light emitting element connected between the first source electrode of the first transistor and a second power line carrying a second driving voltage lower than the first driving voltage.

12. The display device of claim 1, wherein the display device further comprises:
   a buffer layer disposed on the substrate;
   a first gate insulating layer disposed on the buffer layer;
   a first insulating layer disposed on the first gate insulating layer;
   a second insulating layer disposed on the first insulating layer;
   a second gate insulating layer disposed on the second insulating layer;
   a third insulating layer disposed on the second gate insulating layer; and
   a fourth insulating layer disposed on the third insulating layer.

13. The display device of claim 12, wherein one end of the connection line is connected to the fourth drain electrode of the fourth transistor through a first contact hole sequentially penetrating the first gate insulating layer, the first and second insulating layers, the second gate insulating layer, and the third and fourth insulating layers.

14. The display device of claim 13, wherein other end of the connection line is connected to the first drain electrode of the first transistor through a second contact hole sequentially penetrating the second gate insulating layer and the third and fourth insulating layers.

\* \* \* \* \*